US009263531B2

(12) United States Patent
Yamazaki

(10) Patent No.: US 9,263,531 B2
(45) Date of Patent: Feb. 16, 2016

(54) OXIDE SEMICONDUCTOR FILM, FILM FORMATION METHOD THEREOF, AND SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 51 days.

(21) Appl. No.: 14/089,190

(22) Filed: Nov. 25, 2013

(65) Prior Publication Data

US 2014/0145183 A1 May 29, 2014

(30) Foreign Application Priority Data

Nov. 28, 2012 (JP) ................................. 2012-260230

(51) Int. Cl.
*H01L 29/12* (2006.01)
*H01L 29/22* (2006.01)
(Continued)

(52) U.S. Cl.
CPC .......... *H01L 29/22* (2013.01); *H01L 21/02472* (2013.01); *H01L 21/02483* (2013.01);
(Continued)

(58) Field of Classification Search
CPC .................. H01L 21/01422; H01L 21/02472; H01L 21/02483; H01L 21/02502; H01L 21/02554; H01L 29/66969; H01L 21/02631; H01L 27/1225; H01L 29/7869; H01L 29/66742; H01L 21/02667; H01L 21/02565
USPC ........................................ 257/43, 59, 72, 347
See application file for complete search history.

(56) References Cited

U.S. PATENT DOCUMENTS 5,528,032 A  6/1996  Uchiyama
5,731,856 A  3/1998  Kim et al.
(Continued)

FOREIGN PATENT DOCUMENTS

EP  1737044 A  12/2006
EP  2226847 A  9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Dung Le
(74) *Attorney, Agent, or Firm* — Robinson Intellectual Property Law Office; Eric J. Robinson

(57) ABSTRACT

An oxide semiconductor film with high crystallinity is formed. An oxide semiconductor film having a single crystal region, which is formed by a sputtering method using a sputtering target including a polycrystalline oxide containing a plurality of crystal grains, is provided. The plurality of crystal grains contained in the sputtering target has a plane that is cleaved or is likely to be cleaved because of a weak crystal bond; therefore, the cleavage planes in the plurality of crystal grains are cleaved when an ion collides with the sputtering target, whereby flat plate-like sputtered particles can be obtained. The obtained flat plate-like sputtered particles are deposited on a deposition surface; accordingly, an oxide semiconductor film is formed. The flat plate-like sputtered particle is formed by separation of part of the crystal grain and therefore the oxide semiconductor film can have high crystallinity.

8 Claims, 14 Drawing Sheets

(51) Int. Cl.
*H01L 21/02* (2006.01)
*H01L 29/786* (2006.01)

(52) U.S. Cl.
CPC .... *H01L21/02554* (2013.01); *H01L 21/02565* (2013.01); *H01L 21/02631* (2013.01); *H01L 29/7869* (2013.01)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,274,078 B2 | 9/2012 | Itagaki et al. |
| 8,890,159 B2 | 11/2014 | Yamazaki et al. |
| 9,082,863 B2 | 7/2015 | Yamazaki |
| 9,087,726 B2 | 7/2015 | Sato et al. |
| 9,123,573 B2 | 9/2015 | Yamazaki et al. |
| 9,129,568 B2 | 9/2015 | Kubota et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2012/0132906 A1* | 5/2012 | Yamazaki ............... 257/43 |
| 2012/0312681 A1 | 12/2012 | Yamazaki et al. |
| 2012/0325650 A1 | 12/2012 | Yamazaki et al. |
| 2013/0011962 A1 | 1/2013 | Yamazaki et al. |
| 2013/0056727 A1* | 3/2013 | Yamade et al. ............ 257/43 |
| 2014/0110703 A1 | 4/2014 | Yamazaki |
| 2014/0110705 A1 | 4/2014 | Koezuka et al. |
| 2014/0110707 A1 | 4/2014 | Koezuka et al. |
| 2014/0110708 A1 | 4/2014 | Koezuka et al. |
| 2014/0132643 A1 | 5/2014 | Yamazaki et al. |
| 2014/0146033 A1 | 5/2014 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-018479 A | 1/2010 |
| JP | 4415062 | 2/2010 |
| JP | 2010-177431 A | 8/2010 |

(56) References Cited

FOREIGN PATENT DOCUMENTS

| JP | 4571221 | 10/2010 |
|---|---|---|
| WO | WO-2004/114391 | 12/2004 |
| WO | WO-2008/133345 | 11/2008 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3—A2O3—BO Systems [A; Fe, Ga, or A; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Lyer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Applcation", SID Digest '07 : SID International Symposium Digest of Technical Papers, 2007, vol. 38, pp 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Techical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide—Based Thin-Film Transistors by DC Sputtering", SID Digest '09 : SID International Symposim Digest of Technical Papers, May 31, 2009, pp. 191-193.

Cho.D at al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.2:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Paprs, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

(56) References Cited

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 196, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 565-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraiolet Lamp", Journal of Sol-Gel Science and Technlogy, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Lettes), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technogy B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Yamazaki.S et al., "Research, Development, and Application of Crystalline Oxide Semiconductor,", SID Digest '12 : SID International Symposium, Digest of Techical Papers, Jun. 5, 2012, pp. 183-186.

* cited by examiner

OXIDE SEMICONDUCTOR FILM, FILM FORMATION METHOD THEREOF, AND SEMICONDUCTOR DEVICE

BACKGROUND OF THE INVENTION

1. Field of the Invention

The invention disclosed in this specification relates to an object, a method, a method for producing an object, a process, a machine, manufacture, or a composition of matter. In particular, the present invention relates to, for example, a semiconductor device, a display device, a light-emitting device, a driving method thereof, or a manufacturing method thereof. In particular, the present invention relates to, for example, an oxide semiconductor film included in a semiconductor device and a film formation method thereof.

Note that a semiconductor device in this specification and the like refers to all types of devices which can function by utilizing semiconductor characteristics, and electro-optical devices, semiconductor circuits, and electronic devices are all semiconductor devices.

2. Description of the Related Art

A technique by which transistors are formed using semiconductor thin films formed over a substrate having an insulating surface has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, Patent Document 1 discloses a transistor including an amorphous oxide semiconductor film containing In, Ga, and Zn and having an electron carrier concentration of lower than $10^{18}/cm^3$, in which a sputtering method is considered the most suitable as a film formation method of the amorphous oxide semiconductor film.

Although a transistor including an oxide semiconductor film can obtain transistor characteristics relatively with ease, the oxide semiconductor film is likely to be amorphous and has unstable physical properties. Thus, it is difficult to secure reliability of such a transistor.

On the other hand, there is a report that a transistor including a crystalline oxide semiconductor film has more excellent electrical characteristics and higher reliability than a transistor including an amorphous oxide semiconductor film (see Non-Patent Document 1).

REFERENCE

[Patent Document 1] Japanese Published Patent Application No. 2006-165528
[Non-Patent Document 1] Shunpei Yamazaki, Jun Koyama, Yoshitaka Yamamoto, and Kenji Okamoto, "Research, Development, and Application of Crystalline Oxide Semiconductor", *SID* 2012 *DIGEST*, pp. 183-186

SUMMARY OF THE INVENTION

In one embodiment of the present invention, an object is to provide an oxide semiconductor film with high crystallinity.

In one embodiment of the present invention, an object is to provide a highly reliable semiconductor device including an oxide semiconductor film with high crystallinity.

In one embodiment of the present invention, an object is to provide a transistor having low off-state current. In one embodiment of the present invention, an object is to provide a transistor having normally-off characteristics. In one embodiment of the present invention, an object is to provide a transistor in which variation in threshold voltage or deterioration is small.

In one embodiment of the present invention, an object is to provide a method for manufacturing a semiconductor device in which an oxide semiconductor film with high productivity is formed.

Note that the description of these objects does not impede the existence of other objects. Note that in one embodiment of the present invention, there is no need to achieve all the objects. Other objects will be apparent from and can be derived from the description of the specification, the drawings, the claims, and the like.

One embodiment of the disclosed invention is an oxide semiconductor film having a single crystal region, which is formed by a sputtering method using a sputtering target including a polycrystalline oxide containing a plurality of crystal grains.

Here, the plurality of crystal grains contained in the sputtering target has a plane that is cleaved or is likely to be cleaved because of a weak crystal bond (hereinafter simply referred to as a cleavage plane); therefore, the cleavage planes in the plurality of crystal grains are cleaved when an ion collides with the sputtering target, whereby flat plate-like sputtered particles can be obtained. The obtained flat plate-like sputtered particles are deposited on a deposition surface; accordingly, an oxide semiconductor film is formed. The flat plate-like sputtered particle is formed by separation of part of the crystal grain and therefore has high crystallinity.

Specifically, structures described below are employed, for example.

One embodiment of the present invention is an oxide semiconductor film including a single crystal region having a crystal structure including indium, gallium, and zinc, in which the crystal structure of the single crystal region has bonds for forming a hexagonal lattice in an a-b plane and includes a c-axis perpendicular to a deposition surface.

One embodiment of the present invention is an oxide semiconductor film over an amorphous film and without a crystal grain boundary, including a single crystal region having a crystal structure including indium, gallium, and zinc, in which the crystal structure of the single crystal region has bonds for forming a hexagonal lattice in an a-b plane and includes a c-axis perpendicular to a deposition surface.

One embodiment of the present invention is an oxide semiconductor film over an amorphous insulating film and without a crystal grain boundary, including a single crystal region having a crystal structure including indium, gallium, and zinc, in which the crystal structure of the single crystal region has bonds for forming a hexagonal lattice in an a-b plane and includes a c-axis perpendicular to a deposition surface.

One embodiment of the present invention is an oxide semiconductor film including a first oxide semiconductor film having crystallinity including indium, gallium, and zinc; and a second oxide semiconductor film including indium, gallium, and zinc over the first oxide semiconductor film, in which at least the second oxide semiconductor film includes a single crystal region having a crystal structure including indium, gallium, and zinc and does not include a crystal grain boundary, in which the crystal structure of the single crystal region has bonds for forming a hexagonal lattice in an a-b plane and includes a c-axis perpendicular to a deposition surface, and in which the first oxide semiconductor film and the second oxide semiconductor film have different compositions.

One embodiment of the present invention is a semiconductor device including an oxide semiconductor film in which a channel is formed; a gate electrode layer; a gate insulating layer between the oxide semiconductor film and the gate electrode layer; and a source electrode layer and a drain electrode layer each eclectically connected to the oxide semiconductor film, in which the oxide semiconductor film includes a single crystal region having a crystal structure including indium, gallium, and zinc and does not include a crystal grain boundary, and in which the crystal structure of the single crystal region has bonds for forming a hexagonal lattice in an a-b plane and includes a c-axis perpendicular to a deposition surface.

One embodiment of the present invention is a film formation method of an oxide semiconductor film having a single crystal region, in which a sputtering target including a polycrystalline oxide containing a plurality of crystal grains is used; a plasma space containing an ionized gas, in contact with a surface of the sputtering target and a deposition surface is formed; a flat plate-like sputtered particle having a hexagonal flat plane from a cleavage plane corresponding to an a-b plane of each of the plurality of crystal grains is separated by collision of the ionized gas with the surface of the sputtering target; the flat plate-like sputtered particle is moved to the deposition surface with the flat plate-like sputtered particle positively or negatively charged along sides of the hexagon; and the charged flat plate-like sputtered particles are arranged so that one side of the hexagon and one side of another hexagon adjacent to the hexagon are in contact with each other.

According to one embodiment of the present invention, an oxide semiconductor film with high crystallinity and a film formation method thereof can be provided.

According to one embodiment of the present invention, a highly reliable semiconductor device including an oxide semiconductor film with high crystallinity can be provided.

DETAILED DESCRIPTION OF THE INVENTION

Embodiments of the present invention will be described in detail below with reference to the drawings. Note that the present invention is not limited to the description below and it is easily understood by those skilled in the art that the modes and the aspects can be changed in various ways. Therefore, the present invention should not be construed as being limited to the description in the following embodiments.

Note that in each drawing described in this specification, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not indicate the order of steps or the stacking order of layers. In addition, the ordinal numbers in this specification and the like do not denote particular names which specify the present invention.

Embodiment 1

In this embodiment, a crystalline oxide semiconductor film according to one embodiment of the present invention and a film formation method thereof will be described with reference to FIG. 1, FIGS. 2A and 2B, FIGS. 3A and 3B, FIGS. 4A and 4B, and FIG. 5.

Figure 1:
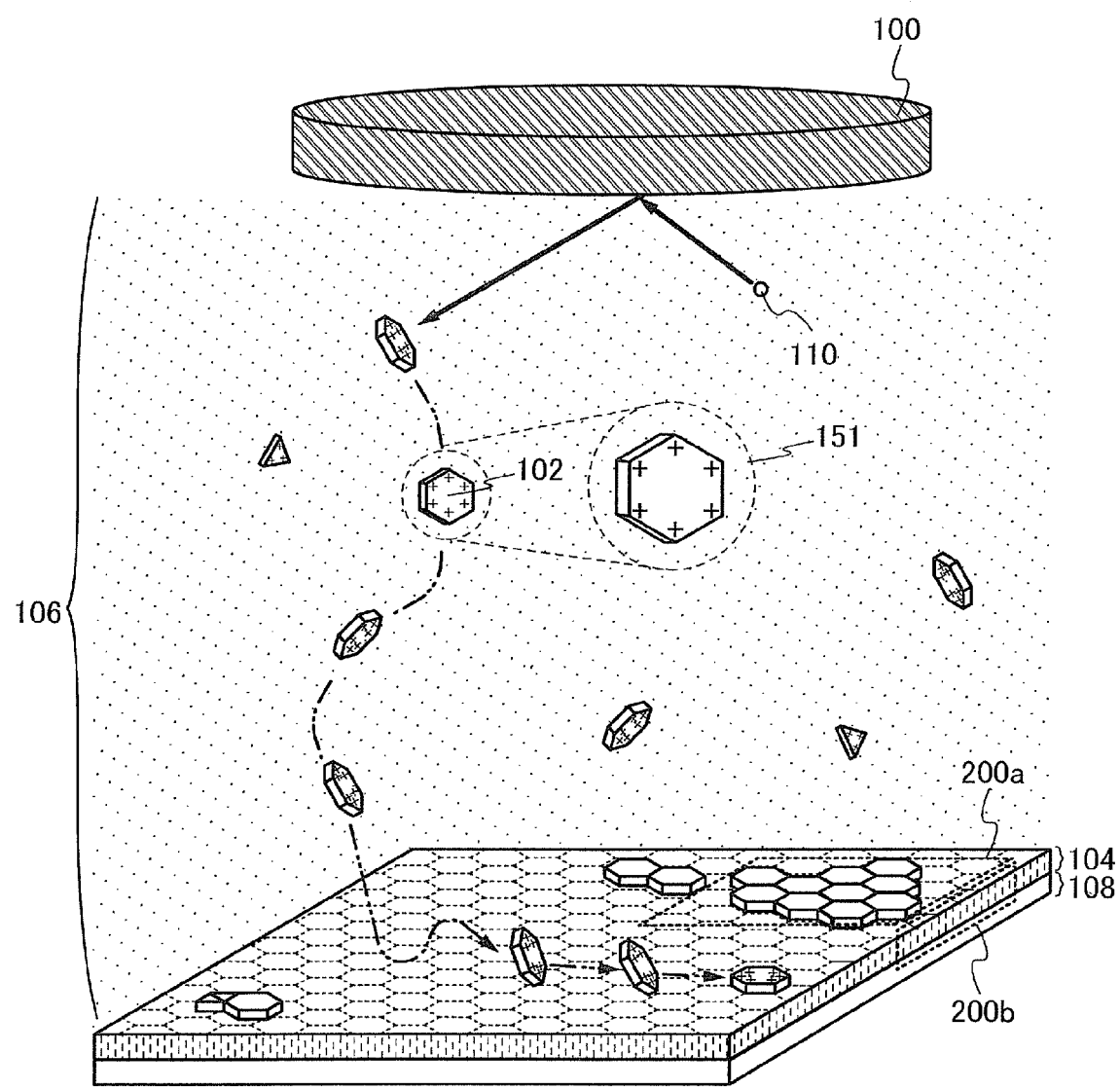
FIG. 1 is a schematic diagram illustrating how a film is formed using a sputtering target.

FIG. 1 is a schematic diagram illustrating a state in which an ion 110 collides with a sputtering target 100 to separate crystalline sputtered particles 102 from the sputtering target 100 and the crystalline sputtered particles 102 are transferred to a deposition surface (here, a surface of a base film 108).

Here, the sputtering target 100 includes a polycrystalline oxide containing a plurality of crystal grains each having a portion where an interatomic bond is weak in a plane parallel to an a-b plane.

For the sputtering target 100, a compound containing indium (In), gallium (Ga), zinc (Zn), and oxygen (O) can be used as a material, for example. Note that the plurality of crystal grains may have different grain sizes and different shapes.

For example, in the case where crystals of a polycrystalline oxide contained in the sputtering target 100 are rhombohedral crystals (trigonal crystals) or hexagonal crystals, the plurality of crystal grains each has a crystal structure in the form of a hexagonal prism and the c-axes in representation of hexagonal system of the crystal structure in the form of a hexagonal prism are oriented randomly. No that that in this specification and the like, an a-axis, a b-axis, or a c-axis of a crystal structure means an a-axis, a b-axis, or a c-axis in representation of hexagonal system. Note that the orientation of the plurality of crystal grains can be measured by electron backscatter diffraction (EBSD), for example.

Then, by collision of the ion 110 with the sputtering target 100, an interatomic bond of a portion where a bond is weak is cut and the crystal grain is cleaved in a plane parallel to an a-b plane; thus, a flat plate-like sputtered particle 102 is separated. Note that in FIG. 1, the sizes of the ion 110 and the sputtered particle 102 are schematically illustrated for convenience of explanation and differ from their actual sizes or scales.

For example, in the case where crystals of a polycrystalline oxide contained in the sputtering target 100 are rhombohedral crystals (trigonal crystals) or hexagonal crystals, the sputtered particle is cleaved from a plane parallel to an a-b plane of each of the crystals, whereby a flat plate-like sputtered particle 102 has a hexagonal prism shape with a regular hexagonal plane whose internal angle is 120°. In the case where the sputtered particle 102 has a hexagonal prism shape, the direction perpendicular to the hexagonal plane is a c-axis direction of the crystal. Note that the flat plate-like sputtered particle 102 is not limited to a hexagonal prism shape, and in some cases, it has a triangular prism shape with a regular triangular plane whose internal angle is 60° or a polygonal prism shape different from the above shapes.

Further, a plasma space 106 containing an ionized gas is formed in contact with a surface of the sputtering target 100 and the deposition surface. Since the plasma space 106 is formed in contact with the deposition surface, a sputtered particle 102 can be efficiently moved to the deposition surface.

As the ionized gas, a gas containing oxygen (O), a gas containing an inert gas (e.g. a rare gas element), or a gas containing oxygen and a rare gas element can be used, for example. As the rare gas element, argon (Ar) or the like is preferably used.

Note that an oxygen cation is used as the ion 110. In addition, a cation of a rare gas (e.g., argon) may be used in addition to the oxygen cation. With use of an oxygen cation as the ion 110, plasma damage at the film formation can be alleviated. Thus, when the ion 110 collides with the surface of the sputtering target 100, a deterioration in crystallinity of the sputtering target 100 can be suppressed or a change of the sputtering target 100 into an amorphous state can be suppressed.

As the cation of a rare gas element, an argon ion ($Ar^+$) can be used, for example.

Although one sputtered particle 102 is separated by collision of one ion 110 in FIG. 1 for convenience of explanation, there is a case where one sputtered particle 102 is separated by collision of a plurality of ions 110 with the surface of the sputtering target 100 at the same time or at different timings. There is also a case where a plurality of sputtered particles 102 are separated by collision of one ion 110 with the surface of the sputtering target 100. The number of separated sputtered particles 102 with respect to the number of ions 110 colliding with the surface of the sputtering target 100 changes depending on the power of a sputtering apparatus, for example.

Here, the separated sputtered particle 102 is preferably charged with positive or negative polarity. At this time, a pair of hexagonal surfaces of the sputtered particle 102 is preferably charged. Note that a case is described in this embodiment as one example in which the sputtered particle 102 is positively charged, but the present invention is not limited to this example and there is also a case in which the sputtered particle 102 is negatively charged.

In addition, as indicated in an enlarged portion 151 of the sputtered particle 102, the sputtered particle 102 having a hexagonal shape may be charged along the sides of the hexagon. When the sputtered particle 102 is charged along the sides of the hexagon, charges on the opposite sides repel each other, the deformation of the sputtered particle 102 flying in the plasma space 106 can be reduced, and the sputtered particle 102 can substantially maintain its flat plate-like shape. Furthermore, there is a case where the charged sputtered particle 102 is neutralized with plasma having the polarity opposite to that of the charge of the sputtered particle 102 and is then charged again.

In the case where a plurality of sputtered particles 102 are separated, it is preferable that the plurality of sputtered particles 102 be all charged with the same polarity.

There is no limitation on the timing when the sputtered particle 102 is charged. For example, the sputtered particle 102 is in some cases charged at the time of the collision of the ion 110. Alternatively, the sputtered particle 102 is in some cases charged by being exposed to plasma in the plasma space 106. Further alternatively, the sputtered particle 102 is in some cases charged in such a manner that the ion 110 is bonded to a side, top, or bottom surface of the flat plate-like sputtered particle 102.

The separated sputtered particle 102 is transferred to the deposition surface through the plasma space 106 with its flat plate-like shape substantially maintained. In the case where the sputtered particle 102 is charged as described above, the sputtered particle 102 substantially maintains its shape while in flight, owing to the charge distribution over the surface of the sputtered particle 102. Therefore, the sputtered particle 102 can move like a kite between the surface of the sputtering target 100 and the deposition surface with its flat plate-like shape substantially maintained and can reach the deposition surface with its flat plate-like shape substantially maintained.

In FIG. 1, a state is shown in which an oxide semiconductor film 104 is formed over the base film 108 by deposition of a plurality of layers of the sputtered particles 102, and a surface of the base film 108 corresponds to the deposition surface. Note that in FIG. 1, the sputtered particles 102 which have been already deposited are shown with a dotted line.

In the case where the separated sputtered particle 102 is charged, the separated sputtered particle 102 repels a sputtered particle 102 which has already been deposited on the deposition surface, whereby the sputtered particle 102 moves to and is deposited on a region where the sputtered particle 102 is not present. Furthermore, a sputtered particle may be deposited on a region where a plurality of sputtered particles 102 are present, so as to be stacked thereon. At this time, the charges carried by the deposited sputtered particles 102 may be lost.

A substrate having the deposition surface is heated to a temperature higher than or equal to 100° C. and lower than or equal to 800° C., preferably higher than or equal to 300° C. As the substrate heating temperature at the time of film formation becomes higher, the impurity concentration of the obtained oxide semiconductor film can be reduced. Further, migration of the sputtered particles 102 on the deposition surface becomes likely to occur or the migration length becomes longer as the substrate heating temperature at the time of film formation becomes higher; therefore, the atomic arrangement in the oxide semiconductor film 104 is ordered and the density thereof is increased, so that an oxide semiconductor film 104 with a high degree of crystallinity can be formed.

In the case where each of the sputtered particles 102 has a hexagonal prism shape, when the substrate is heated to a high temperature at the time of film formation, migration of the sputtered particles 102 occurs on the deposition surface and the sputtered particles 102 each having a hexagonal prism shape are arranged with high density in such a manner that one side of a hexagon and one side of another hexagon adjacent thereto are in contact with each other; thus, a single crystal region is formed in some cases. For example, the sputtered particles each having a hexagonal prism shape are arranged with high density in the oxide semiconductor film 104 without any space, whereby ideally, the oxide semiconductor film 104 can be a single-crystal oxide semiconductor film.

When the sputtered particles 102 are deposited on the deposition surface so as to be adjacent to each other as described above, it is possible to form the oxide semiconductor film 104 where no grain boundary can be found even when observed with a transmission electron microscope (also referred to as TEM), for example. In addition, the sputtered particles 102 are deposited such that the c-axes are arranged substantially perpendicular to the deposition surface. Thus, a crystal portion of an oxide semiconductor film to be formed is aligned along one crystal axis. For example, in the case where a cleavage plane of a crystal grain is parallel to an a-b plane, a crystal part of an oxide semiconductor film has c-axis alignment. In other words, the normal vector of the deposition surface is parallel to the c-axis of each crystal part included in the oxide film. However, the a-axis is freely rotatable about the c-axis, and therefore, a plurality of crystal parts included in the oxide semiconductor film have non-uniform a-axis directions in some cases.

The oxide semiconductor film 104 includes a single crystal region and a non-single-crystal region and can be a single-crystal and non-single-crystal mixed phase film without a crystal grain boundary. Alternatively, ideally, the oxide semiconductor film 104 can be a single-crystal oxide semiconductor film. Note that in this specification and the like, in the case where no grain boundary can be found when observed with a transmission electron microscope or the like, it is considered that a crystal grain boundary does not exist, for convenience.

Note that the oxide semiconductor film 104 is preferably formed over an insulating surface. In FIG. 1, the base film 108 is preferably an insulating film. Alternatively, the substrate having a deposition surface is preferably in an electrically floating state in a film formation apparatus. This can prevent a charge carried by a sputtered particle deposited on the deposition surface from being easily lost.

A film formation chamber in the sputtering apparatus is preferably evacuated to high vacuum (about $1 \times 10^{-4}$ Pa to $5 \times 10^{-7}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

The film formation is preferably performed in an oxygen gas atmosphere. When the film formation is performed in an oxygen gas atmosphere, plasma damage is alleviated and a surplus atom such as a rare gas atom is not contained in the oxide semiconductor film, whereby an oxide semiconductor film with a high degree of crystallinity is likely to be formed. Note that the film formation may be performed in a mixed atmosphere including an oxygen gas and a rare gas. In that case, the percentage of an oxygen gas is higher than or equal to 30 vol. %, preferably higher than or equal to 50 vol. %, more preferably higher than or equal to 80 vol. %.

Note that besides the high vacuum evacuation of the film formation chamber, the use of a highly purified gas having a dew point of $-40°$ C. or lower, preferably $-80°$ C. or lower, still preferably $-100°$ C. or lower, as a deposition gas such as an oxygen gas or an argon gas, can prevent entry of moisture or the like into the oxide semiconductor film as much as possible.

In film formation, when the oxygen flow rate is high and the pressure inside a chamber is high, oxygen ions are attached to the flat plate-like sputtered particle, so that the flat plate-like sputtered particle can have much oxygen on its surface. Another flat plate-like sputtered particle is stacked thereover before the attached oxygen is released; thus, much oxygen can be contained in the film. This adsorbed oxygen contributes to a reduction in oxygen vacancies in the oxide semiconductor.

Note that as a sputtering apparatus, it is preferable to employ a sputtering apparatus using a direct-current (DC) power source or a sputtering apparatus using a high-frequency (RF) power source. The reason for this is as follows. A sputtering apparatus using an alternate-current (AC) power source has a structure in which each of two adjacent targets alternates between a cathode potential and an anode potential at a constant frequency. When one of targets is at an anode potential, there is a moment when no electric field is applied to a peripheral region of the target and thus the charges carried by the sputtered particle may be lost and the structure of the sputtered particle may be deformed.

FIG. 1 illustrates an example in which the deposition surface is provided below the sputtering target 100. However, a positional relationship between the sputtering target 100 and the deposition surface is not limited to this example.

The sputtered particle 102 that reaches the deposition surface is deposited on the deposition surface such that the a-b plane is substantially parallel to the deposition surface. The sputtered particle 102 separated in the above manner has high crystallinity because it is formed by separating part of the crystal grains of the sputtering target 100. Therefore, by deposition of the sputtered particle 102 on the deposition surface, an oxide film with high crystallinity can be formed.

Figure 2A:
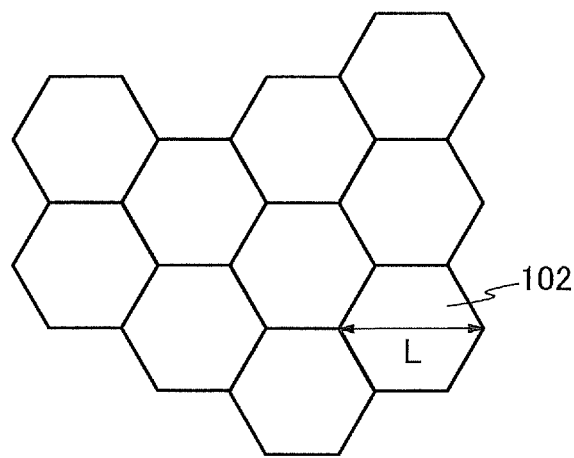
FIGS. 2A and 2B are an enlarged plan view and an enlarged cross-sectional view of a crystalline oxide semiconductor film, respectively.
Figure 2B:
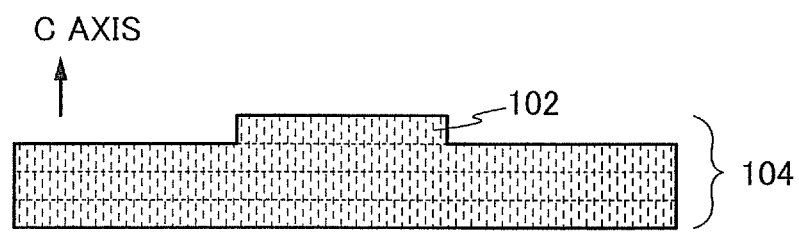

FIG. 2A illustrates a plan view of a region 200a of the oxide semiconductor film 104 in FIG. 1. FIG. 2B illustrates a cross-sectional view of a region 200b of the oxide semiconductor film 104 in FIG. 1.

As illustrated in FIG. 2A, in the oxide semiconductor film shown in this embodiment, the sputtered particle 102 moves on a surface over the deposition surface and is in contact with another sputtered particle. This is repeated, and thus a single crystal region is formed in which the sputtered particles are arranged with high density in such a manner that sides of hexagons (triangles) are adjacent to each other in a plane parallel to the deposition surface.

Here, the direction perpendicular to the hexagonal plane of the sputtered particle 102 is a c-axis direction of the crystal. In the case where the sputtered particle 102 has a hexagonal prism shape, the length of the diagonal line of a hexagonal plane (L in FIG. 2A) is preferably greater than or equal to 0.1 nm and less than or equal to 10 nm. Further, the height of a hexagonal prism corresponds to approximately one third of the lattice constant in representation of the hexagonal system. For example, when a sputtered particle is separated from part of the crystal grains each of which has a rhombohedral (trigonal) or hexagonal crystal structure including indium, gallium, and zinc, the height of the hexagonal prism is approximately 0.6 nm to 0.7 nm.

Further, as illustrated in FIG. 2B, the sputtered particles 102 are deposited so as to be arranged such that the c-axes are substantially perpendicular to the deposition surface. Therefore, the oxide semiconductor film 104 obtained by deposition is a crystalline oxide semiconductor film which has a uniform crystal orientation, preferably a single-crystal oxide semiconductor film.

By film formation of an oxide semiconductor film with the above film formation method, a crystalline oxide semiconductor film with high crystallinity and a uniform crystal orientation can be formed.

In addition, since sputtered particles are orderly arranged on the deposition surface through such a sputtering process, an oxide semiconductor film formed on the deposition surface has an extremely flat upper surface. The flatness of the upper surface of the oxide semiconductor film contributes to improvement of electrical characteristics of a transistor manufactured using the oxide film for a channel formation region.

In the case where the base film 108 has a crystal structure of constituent elements different from those of the oxide semiconductor film 104, a mismatch occurs between the lattice constant of the deposition surface and the lattice constant of a sputtered particle deposited on the deposition surface, and lattice distortion is generated. In addition, in the case where the base film 108 has a crystal structure of constituent elements different from those of the oxide semiconductor film 104, similar distortion is generated due to internal stress in the crystal structure. Therefore, in such a case, the crystallinity of an oxide semiconductor film 104 formed by deposition of sputtered particles might be lowered. Furthermore, when the base film 108 has minute surface unevenness, the crystallinity of an oxide semiconductor film to be formed might be lowered.

Therefore, in order to form an oxide semiconductor film having high crystallinity, a surface of a material having an amorphous structure is suitable for the base film 108 where sputtered particles are deposited. In the case of the material having an amorphous structure, there is no or little internal stress in a particular direction, and the generation of distortion resulting from a crystal structure is suppressed. In addition, it is effective to increase the planarity of the base film 108.

As such a material having an amorphous structure, an insulating film such as a silicon oxide film, a silicon oxynitride film, a silicon nitride oxide film, or a silicon nitride film having an amorphous structure, an oxide film having an amorphous structure, or the like may be used, for example.

Figure 3A:
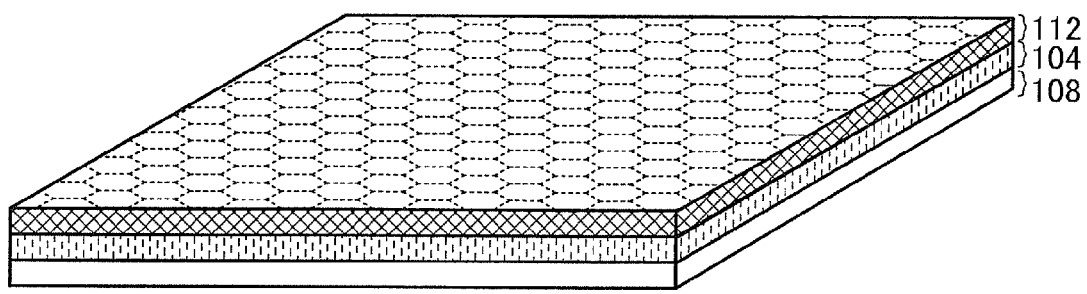
FIGS. 3A and 3B illustrate a stacked structure of a crystalline oxide semiconductor film.
Figure 3B:
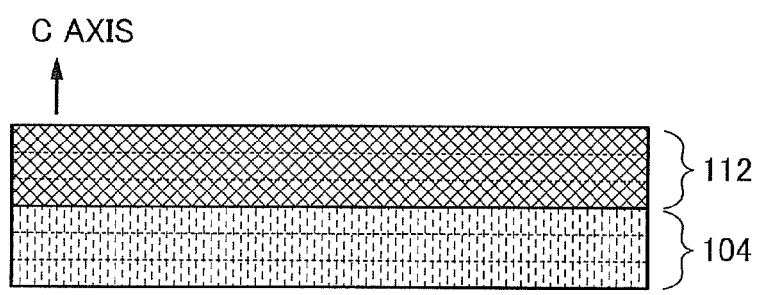

Note that as illustrated in FIGS. 3A and 3B, a crystalline oxide semiconductor film 112 may be formed over a crystalline oxide semiconductor film 104. Here, the oxide semiconductor film 112 contains one, two, or more elements contained in the oxide film 104. The oxide semiconductor film 112 is formed using a sputtering target containing a polycrystalline oxide including a plurality of crystal grains, which is different from the sputtering target used for the oxide semiconductor film 104.

The oxide semiconductor film 112 contains one, two, or more elements contained in the oxide semiconductor film 104; therefore, by deposition of the flat plate-like sputtered particles separated from the plurality of crystal grains contained in the sputtering target over the crystalline oxide semiconductor film 104, epitaxial growth occurs from the oxide semiconductor film 104. Accordingly, the oxide semiconductor film 112 can be an oxide semiconductor film having a single crystal region.

Further, as illustrated in FIG. 3B, also in film formation of the oxide semiconductor film 112, the sputtered particles are deposited so as to be arranged such that the c-axes are substantially perpendicular to the deposition surface. Therefore, each of the oxide semiconductor film 104 and the oxide semiconductor film 112 obtained by deposition is a crystalline oxide semiconductor film which has a uniform crystal orientation. Note that the composition of the oxide semiconductor film 104 may be different from that of the oxide semiconductor film 112.

Figure 4A:
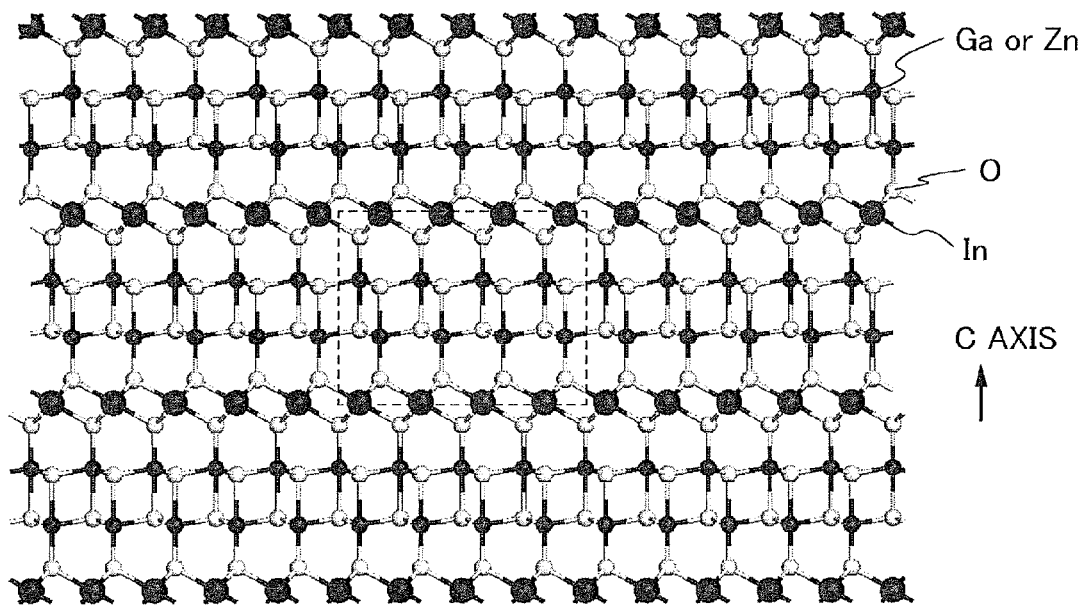
FIGS. 4A and 4B are diagrams illustrating an example of a crystal structure of an In—Ga—Zn oxide.

FIG. 4A illustrates an example of a crystal structure of an In—Ga—Zn oxide seen from a direction parallel to the a-b plane, as an example of the crystal grains included in the sputtering target 100. Further, FIG. 4B illustrates an enlarged portion surrounded by a dashed line in FIG. 4A.

Figure 4B:
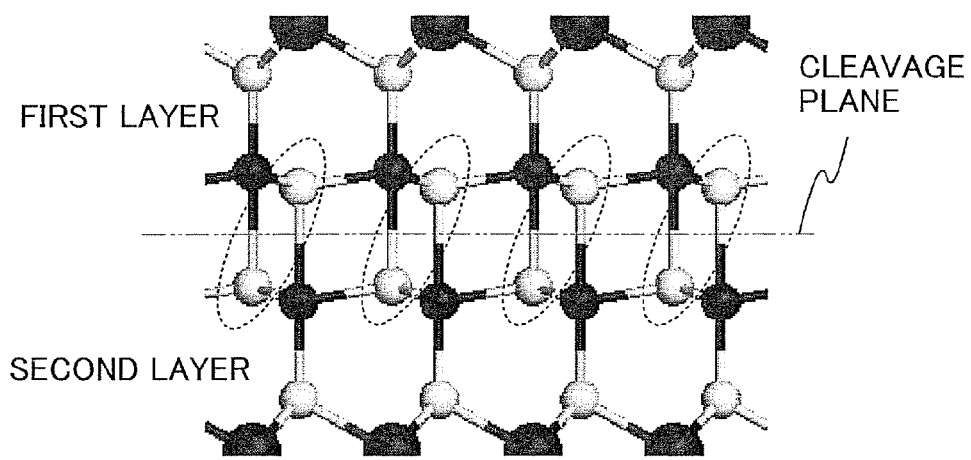

For example, in a crystal grain of an In—Ga—Zn oxide, a cleavage plane is a plane between a first layer and a second layer as illustrated in FIG. 4B. The first layer includes at least one of a gallium atom and a zinc atom, and an oxygen atom, and the second layer includes at least one of a gallium atom and a zinc atom, and an oxygen atom. This is because oxygen atoms having negative charge in the first layer and oxygen atoms having negative charge in the second layer are close to each other (see a portion surrounded by a dotted line in FIG. 4B). Since the cleavage plane is a plane parallel to an a-b plane, the sputtered particle including an In—Ga—Zn oxide has a flat plate-like shape having a flat plane parallel to an a-b plane.

Figure 5:
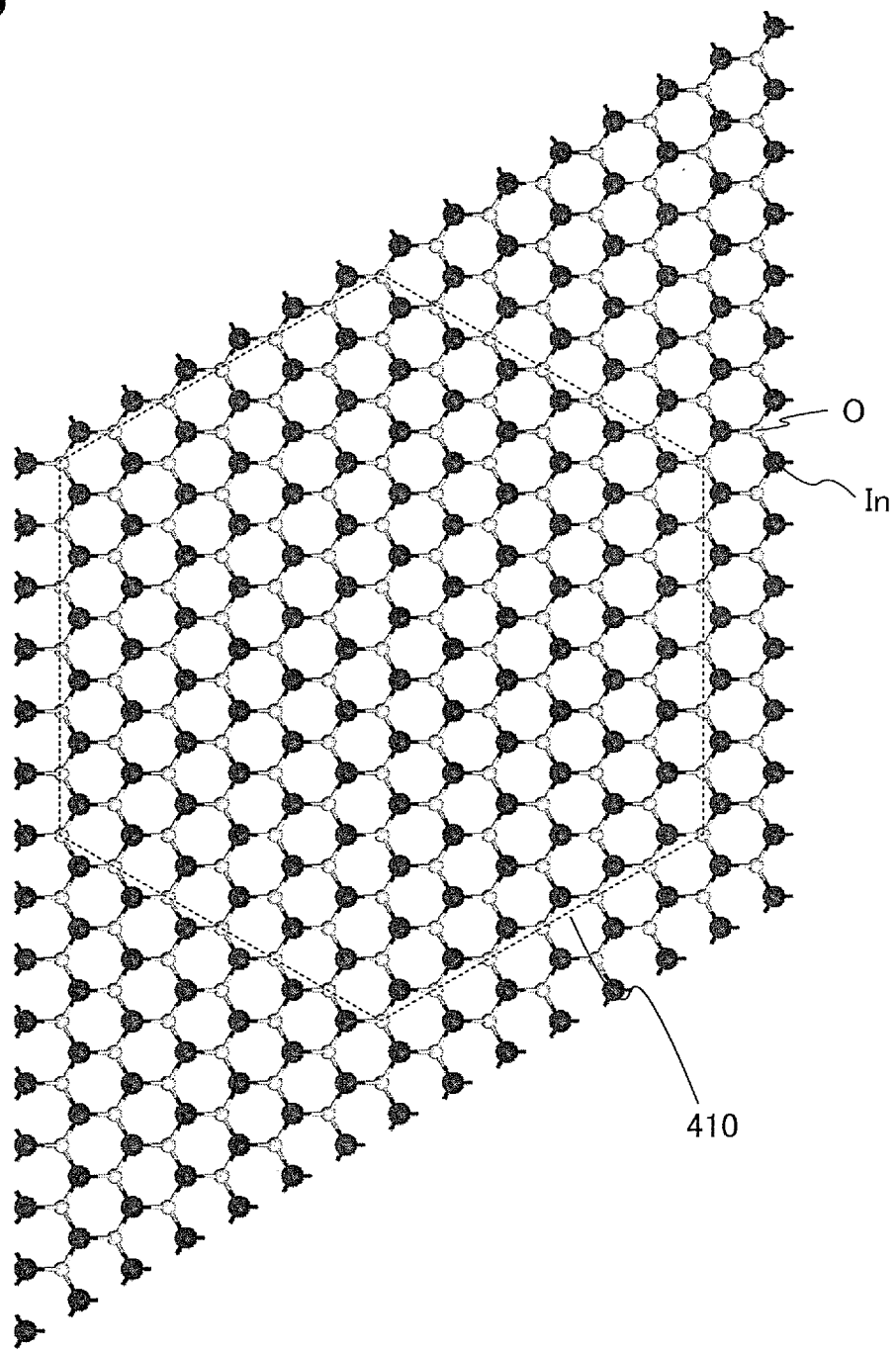
FIG. 5 is a diagram illustrating an example of a crystal structure of an In—Ga—Zn oxide.

FIG. 5 illustrates an example of a crystal structure of an In—Ga—Zn oxide viewed from a direction perpendicular to an a-b plane of the crystal. Note that in FIG. 5, only a layer including indium atoms and oxygen atoms is extracted.

In the In—Ga—Zn oxide, a bond between an indium atom and an oxygen atom is weak and cut most easily. When the bond is cut, the oxygen atom is detached, and vacancies of oxygen atoms (also referred to as oxygen vacancy) are sequentially caused as shown in a region 410 in FIG. 5. In FIG. 5, a regular hexagonal shape can be traced by connecting the oxygen vacancies by the dotted line. As described above, the crystal of the In—Ga—Zn oxide has a plurality of planes which are perpendicular to an a-b plane and generated when the bonds between indium atoms and oxygen atoms are cut.

The crystal of the In—Ga—Zn oxide is a rhombohedral crystal (a trigonal crystal) or a hexagonal crystal; thus, the flat plate-like sputtered particle is likely to have a hexagonal prism shape with a regular hexagonal plane whose internal angle is 120°. Note that the flat plate-like sputtered particle is not limited to a hexagonal prism shape, and in some cases, it has a triangular prism shape with a regular triangular plane whose internal angle is 60° or a polygonal prism shape different from the above shapes.

Accordingly, the single crystal region in which the sputtered particles separated from crystals of the In—Ga—Zn oxide are arranged with high density, which is included in the oxide semiconductor film of this embodiment, includes a crystal structure where bonds for forming hexagonal lattices are formed in the a-b plane and the c-axes are perpendicular to the deposition surface.

The oxide semiconductor film described in this embodiment can be used for a channel region of a transistor. Particularly, with the use of the single crystal region of the oxide semiconductor film described in this embodiment for a channel region of a transistor, the transistor can have excellent electrical characteristics and high reliability. The oxide semiconductor film may also be used as a transparent conductive film.

The methods and structures described in this embodiment can be combined as appropriate with any of the methods and structures described in the other embodiments.

Embodiment 2

In this embodiment, a sputtering target which can be used for forming an oxide semiconductor film of one embodiment of the present invention will be described.

Figure 6:
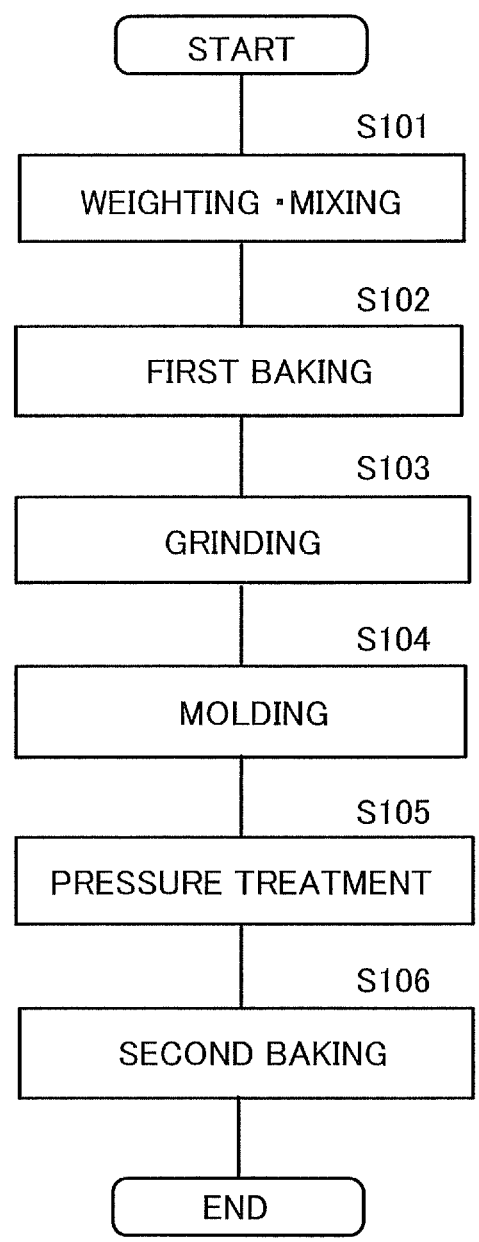
FIG. 6 is a flow chart illustrating an example of a fabrication process of a sputtering target.

FIG. 6 shows an example of a fabrication process of a sputtering target.

First, raw materials are weighed and are mixed in a predetermined molar ratio (step S101).

In this embodiment, description is given on the case where an oxide powder containing In, M, and Zn (also referred to as an In-M-Zn oxide powder) is obtained as the oxide powder containing a plurality of metal elements.

Specifically, $InO_X$ oxide powder, $MO_Y$ oxide powder, and $ZnO_Z$ powder are prepared and mixed in a predetermined molar ratio. Note that X, Y, and Z are each a given positive number; for example, X, Y, and Z are 1.5, 1.5, and 1, respectively.

It is needless to say that the above oxide powders are an example, and oxide powders can be selected as appropriate in order to obtain a desired composition. Note that M refers to Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

The predetermined molar ratio of the $InO_X$ powder to the $MO_Y$ powder and the $ZnO_Z$ powder is, for example, 2:2:1, 8:4:3, 3:1:1, 1:1:1, 4:2:3, 1:1:2, 3:1:4, or 3:1:2. With such a molar ratio, a sputtering target including a polycrystalline oxide with high crystallinity can be obtained easily later.

Next, an In-M-Zn oxide is obtained by performing first baking on the $InO_X$ powder, the $MO_Y$ powder, and the $ZnO_Z$ powder which are mixed in a predetermined molar ratio (Step S102).

Note that the first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, and the concentration of impurities in the In-M-Zn oxide powder can be reduced. Accordingly, the crystallinity of the In-M-Zn oxide powder can be increased.

The first baking may be performed plural times at different temperatures and/or in different atmospheres. For example, the In-M-Zn oxide powder may be first held at a first temperature in a first atmosphere and then at a second temperature in a second atmosphere. Specifically, it is preferable that the first atmosphere be an inert atmosphere or a reduced-pressure atmosphere and the second atmosphere be an oxidation atmosphere. This is because oxygen vacancies are generated in the In-M-Zn oxide when impurities contained in the In-M-Zn oxide powder are reduced in the first atmosphere. Therefore, it is preferable that oxygen vacancies in the obtained In-M-Zn oxide be reduced in the second atmosphere. The impurity concentration and oxygen vacancies in the In-M-Zn oxide are reduced, whereby the crystallinity of the In-M-Zn oxide powder can be increased.

Next, the In-M-Zn oxide powder is obtained by grinding the In-M-Zn oxide that is a reaction product (Step S103).

The In-M-Zn oxide includes many surface structures which are parallel to the a-b plane. Therefore, the obtained In-M-Zn oxide powder includes many flat plate-like crystal grains whose top and bottom surfaces are parallel to the a-b plane. Moreover, the crystal of the In-M-Zn oxide is in many cases a rhombohedral crystal (a trigonal crystal) or a hexagonal crystal; therefore, in many cases, the above flat plate-like crystal grains each have the shape of a hexagonal cylinder whose top and bottom surfaces are approximately equilateral hexagons each having internal angles of 120°.

Note that it is preferable that the grinding be performed so that the average grain size of the In-M-Zn oxide powder is less than or equal to 3 μm, preferably less than or equal to 2.5 μm, more preferably less than or equal to 2 μm. After the grinding, the In-M-Zn oxide powder whose grain size is less than or equal to 3 μm, preferably less than or equal to 2.5 μm, more preferably less than or equal to 2 μm may be sorted using a grain size filter.

Next, the In-M-Zn oxide powder is spread over a mold and molded; accordingly, a molded body is formed (Step S104). Here, molding refers to spreading powder or the like over a mold to obtain a uniform thickness. Specifically, the In-M-Zn oxide powder is introduced to the mold, and then vibration is externally applied so that the In-M-Zn oxide powder is molded. Alternatively, the In-M-Zn oxide powder is introduced to the mold, and then molding is performed using a roller or the like so as to obtain a uniform thickness.

Note that in the step S104, slurry in which the In-M-Zn oxide powder is mixed with water, a dispersant, and a binder may be molded. In that case, the slurry is poured into the mold and then molded by sucking the mold from the bottom. After that, drying treatment is performed on a molded body after the mold is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal grains whose top and bottom surfaces are parallel to the a-b plane is spread over the mold and molded, the crystal grains are arranged with the planes which are parallel to the a-b plane thereof facing upward. Therefore, the proportion of the surface structures of planes parallel to the a-b plane can be increased in the obtained molded body. Note that the mold may be formed of a metal or an oxide and the upper shape thereof is rectangular or rounded.

The obtained molded body is subjected to pressure treatment (Step S105). The pressure treatment may be performed in any manner as long as the molded body can be pressed. For example, a weight which is formed of the same kind of material as the mold can be used. Alternatively, the In-M-Zn oxide powder may be pressed under a high pressure using compressed air. Besides, the pressure treatment can be performed using a known technique. The pressure treatment performed on the molded body enables a crystal part in the In-M-Zn oxide included in the molded body to have high orientation. Further, a void in the molded body can be made smaller.

Next, second baking is performed on the molded body which has been subjected to the pressure treatment, so that a sintered body is formed (Step S106). The second baking is performed under conditions and methods similar to those of the first baking. The crystallinity of a sintered body can be increased by performing the second baking. Note that the pressure treatment may be performed at the same time as the second baking.

Next, finishing treatment is performed on the sintered body, so that a sputtering target is obtained. Specifically, the sintered body is divided or grounded so as to adjust the length, the width, and the thickness. Further, since abnormal discharge might occur when a surface of the sintered body has minute unevenness, polishing treatment is performed on the surface. The polishing treatment is preferably performed by chemical mechanical polishing (CMP).

Through the above steps, a sputtering target including a polycrystalline oxide containing a plurality of crystal grains can be formed. An oxide semiconductor film with high crystallinity can be formed with the sputtering target obtained through the process of this embodiment.

Note that the sputtering target formed in such a manner can have high density. When the density of the sputtering target is increased, the density of a film to be deposited can also be increased. Specifically, the relative density of the sputtering target can be set to be higher than or equal to 90%, higher than or equal to 95%, or higher than or equal to 99%.

The methods and structures described in this embodiment can be combined as appropriate with any of the methods and structures described in the other embodiments.

Embodiment 3

In this embodiment, a structure example of a transistor to which the oxide semiconductor film including a single crystal region which is described in Embodiment 1 is applied will be described with reference to drawings. Note that the oxide semiconductor film formed by a sputtering method with the use of a sputtering target including a polycrystalline oxide containing a plurality of crystal grains is described in Embodiment 1; however, one embodiment of the present invention is not limited thereto. An oxide semiconductor film including a single crystal region which is formed without using a sputtering method can be used in some cases. Alternatively, an oxide semiconductor film including a single crystal region which is formed without using a sputtering target including a polycrystalline oxide containing a plurality of crystal grains can be used in some cases.

<Structure Example of Transistor>

Figure 7A:
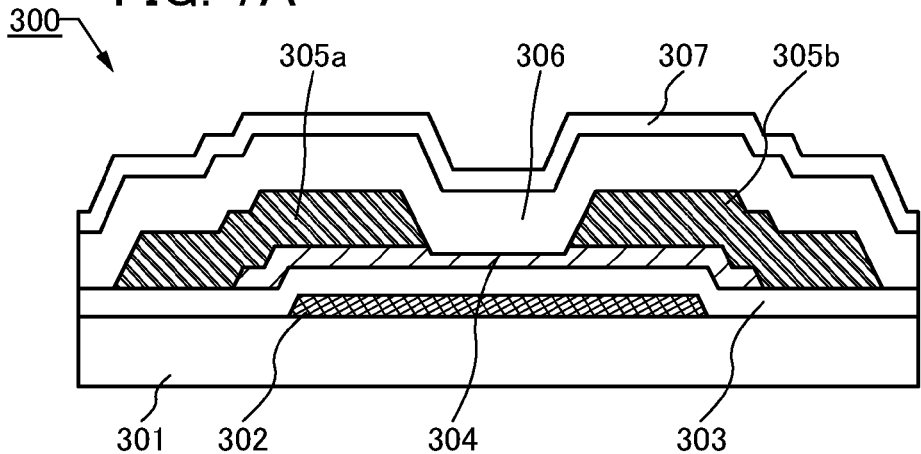
FIGS. 7A to 7C illustrate structure examples of transistors according to one embodiment.

FIG. 7A illustrates a schematic cross-sectional view of a transistor 300. The transistor 300 exemplified by this structure example is a bottom-gate transistor.

The transistor 300 includes a gate electrode layer 302 over a substrate 301, an insulating layer 303 over the substrate 301 and the gate electrode layer 302, an oxide semiconductor film 304 over the insulating layer 303, which overlaps with the gate electrode layer 302, and a source electrode layer 305a and a drain electrode layer 305b which are in contact with the top surface of the oxide semiconductor film 304. Moreover, an insulating layer 306 covers the insulating layer 303, the oxide semiconductor film 304, the source electrode layer 305a, and the drain electrode layer 305b; and an insulating layer 307 is over the insulating layer 306.

The oxide semiconductor film of one embodiment of the present invention can be applied to the oxide semiconductor film 304 included in the transistor 300.

<<Substrate 301>>

There is no particular limitation on the property of a material and the like of the substrate 301 as long as the material has heat resistance enough to withstand at least heat treatment which will be performed later. For example, a glass substrate, a ceramic substrate, a quartz substrate, a sapphire substrate, or a yttria-stabilized zirconia (YSZ) substrate may be used as the substrate 301. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 301. Still alternatively, any of these substrates provided with a semiconductor element may be used as the substrate 301.

Still alternatively, a flexible substrate such as a plastic substrate may be used as the substrate 301, and the transistor 300 may be provided directly on the flexible substrate. Further alternatively, a separation layer may be provided between the substrate 301 and the transistor 300. The separation layer can be used when part or the whole of the transistor formed over the separation layer is formed and separated from the substrate 301 and transferred to another substrate. Thus, the transistor 300 can be transferred to a substrate having low heat resistance or a flexible substrate.

<<Gate Electrode Layer 302>>

The gate electrode layer 302 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Furthermore, the gate electrode layer 302 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode layer 302 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 302 and the insulating layer 303. These films each have a work function higher than or equal to 5 eV or higher than or equal to 5.5 eV, which is higher than the electron affinity of an oxide semiconductor; thus, the threshold voltage of a transistor including the oxide semiconductor can be shifted in the positive direction, and accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 304, specifically, an In—Ga—Zn-based oxynitride semiconductor film having a nitrogen concentration of 7 at. % or higher is used.

<<Insulating Layer 303>>

The insulating layer 303 functions as a gate insulating film. The insulating layer 303 in contact with the bottom surface of the oxide semiconductor film 304 is preferably an amorphous film. That is, in the transistor 300, the insulating layer 303 corresponds to the base film 108 in Embodiment 1.

The insulating layer 303 may be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like.

The insulating layer 303 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

<<Source Electrode Layer 305a and Drain Electrode Layer 305b>>

The source electrode layer 305a and the drain electrode layer 305b can be formed to have a single-layer structure or a stacked-layer structure using, as a conductive material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Further, for at least a portion which is in contact with the oxide semiconductor film 304 of the source electrode layer 305a and the drain electrode layer 305b, a material which can generate oxygen vacancies by gaining oxygen from part of the oxide semiconductor film 304 is preferably used. In a region where oxygen vacancies are generated in the oxide semiconductor film 304, the carrier concentration is increased; the region becomes n-type to be an n-type region (n$^+$ layer). Therefore, the region can serve as a source region or a drain region. As an example of a material which gains oxygen from part of the oxide semiconductor film 304 and with which oxygen vacancies can be generated, tungsten, titanium, or the like can be given.

Further, the entire region overlapping with the source electrode layer 305a of the oxide semiconductor film 304 and the entire region overlapping with the drain electrode layer 305b of the oxide semiconductor film 304 may serve as the source region and the drain region, respectively, depending on a material for forming the oxide semiconductor film 304 or the thickness thereof.

When the source region and the drain region are formed in the oxide semiconductor film 304, contact resistance between the oxide semiconductor film 304 and each of the source electrode layer 305a and the drain electrode layer 305b can be reduced. Accordingly, the electrical characteristics of the transistor, such as the field-effect mobility and the threshold voltage, can be favorable.

<<Insulating layers 306 and 307>>

The insulating layer 306 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

As the insulating layer 306, a silicon oxide film, a silicon oxynitride film, or the like can be formed.

Note that the insulating layer 306 also functions as a film which relieves damage to the oxide semiconductor film 304 at the time of forming the insulating layer 307 later.

Alternatively, an oxide film transmitting oxygen may be provided between the insulating layer 306 and the oxide semiconductor film 304.

As the oxide film transmitting oxygen, a silicon oxide film, a silicon oxynitride film, or the like can be formed. Note that in this specification, a "silicon oxynitride film" refers to a film that includes more oxygen than nitrogen, and a "silicon nitride oxide film" refers to a film that includes more nitrogen than oxygen.

The insulating layer 307 can be formed using an insulating film having a blocking effect against oxygen, hydrogen, water, and the like. It is possible to prevent outward diffusion of oxygen from the oxide semiconductor film 304 and entry of hydrogen, water, or the like into the oxide semiconductor film 304 from the outside by providing the insulating layer 307 over the insulating layer 306. As for the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

<Example of Manufacturing Method of Transistor>

Figure 7B:
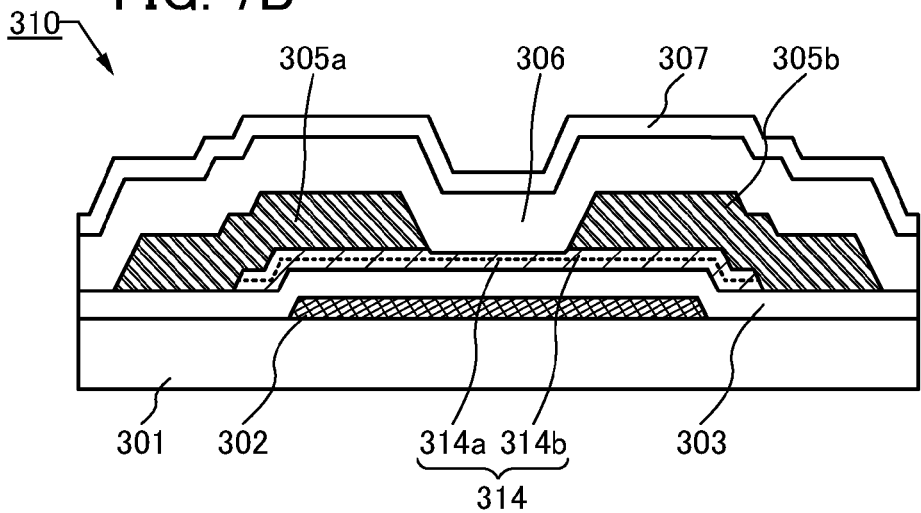
Figure 7C:
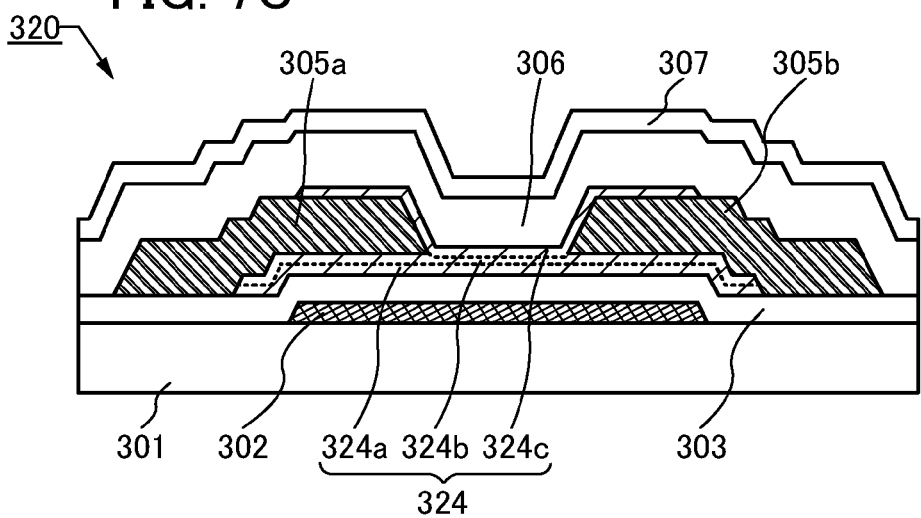

Next, an example of a manufacturing method of the transistor 300 exemplified in FIGS. 7A to 7C is described.

Figure 8A:
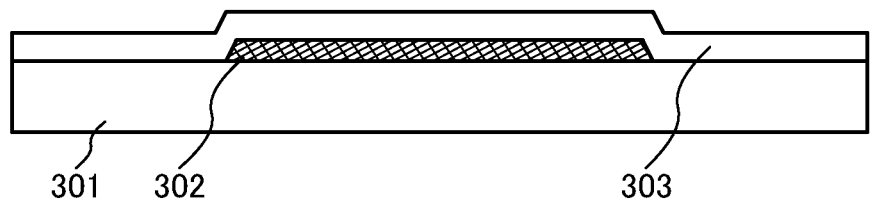
FIGS. 8A to 8D illustrate an example of a method for manufacturing a transistor according to one embodiment.

First, as illustrated in FIG. 8A, the gate electrode layer 302 is formed over the substrate 301, and the insulating layer 303 is formed over the gate electrode layer 302.

Here, a glass substrate is used as the substrate 301.

<<Formation of Gate Electrode Layer>>

A formation method of the gate electrode layer 302 is described below. First, a conductive film is formed by a sputtering method, a CVD method, an evaporation method, or the like and then a resist mask is formed over the conductive film using a first photomask by a photolithography process. Then, part of the conductive film is etched using the resist mask to form the gate electrode layer 302. After that, the resist mask is removed.

Note that instead of the above formation method, the gate electrode layer 302 may be formed by an electrolytic plating method, a printing method, an ink-jet method, or the like.

<<Formation of Gate Insulating Layer>>

The insulating layer 303 serving as a gate insulating layer is formed by a sputtering method, a CVD method, an evaporation method, or the like.

In the case where the insulating layer 303 is formed using a silicon oxide film, a silicon oxynitride film, or a silicon nitride oxide film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

In the case of forming a silicon nitride film as the insulating layer 303, it is preferable to use a two-step formation method. First, a first silicon nitride film with few defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having few defects and a blocking property against hydrogen can be formed as the insulating layer 303.

Moreover, in the case of forming a gallium oxide film as the insulating layer 303, a metal organic chemical vapor deposition (MOCVD) method can be employed.

<<Formation of Oxide Semiconductor Film>>

Figure 8B:
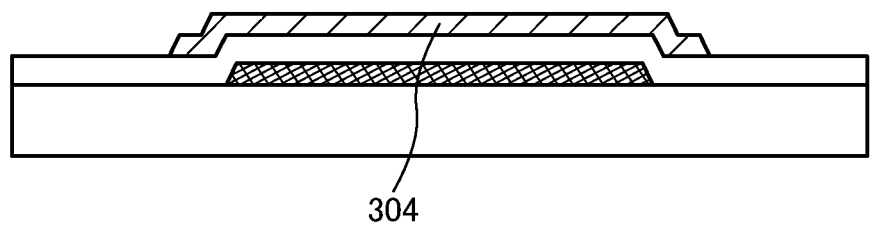

Next, as illustrated in FIG. 8B, the oxide semiconductor film 304 is formed over the insulating layer 303.

A formation method of the oxide semiconductor film 304 is described below. First, an oxide semiconductor film having a single crystal region is formed using the method described in Embodiment 1. Then, a resist mask is formed over the oxide semiconductor film using a second photomask by a photolithography process. Then, part of the oxide semiconductor film is etched using the resist mask to form the oxide semiconductor film 304. After that, the resist mask is removed.

After that, heat treatment may be performed. In such a case, the heat treatment is preferably performed under an atmosphere containing oxygen.

<<Formation of Source Electrode Layer and Drain Electrode Layer>>

Figure 8C:
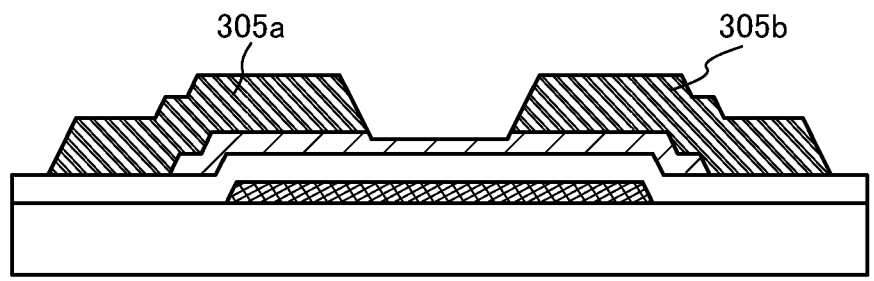

Next, as illustrated in FIG. 8C, the source electrode layer 305a and the drain electrode layer 305b are formed.

A formation method of the source electrode layer 305a and the drain electrode layer 305b is described below. First, a conductive film is formed by a sputtering method, a CVD method, an evaporation method, or the like. Then, a resist mask is formed over the conductive film using a third photomask by a photolithography process. Then, part of the conductive film is etched using the resist mask to form the source electrode layer 305a and the drain electrode layer 305b. After that, the resist mask is removed.

Note that as illustrated in FIG. 8B, the upper part of the oxide semiconductor film 304 is in some cases partly etched and thinned by the etching of the conductive film.

<<Formation of Insulating Layer>>

Figure 8D:
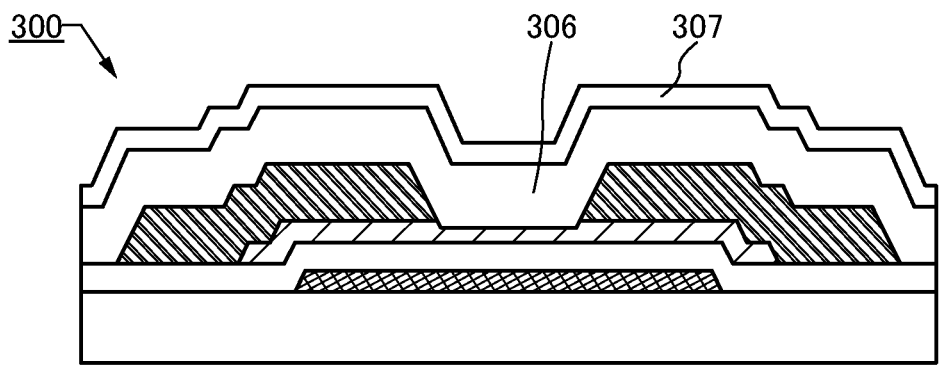

Next, as illustrated in FIG. 8D, the insulating layer 306 is formed over the oxide semiconductor film 304, the source electrode layer 305a, and the drain electrode layer 305b, and the insulating layer 307 is successively formed over the insulating layer 306.

In the case where the insulating layer 306 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

For example, a silicon oxide film or a silicon oxynitride film is formed under the conditions as follows: the substrate placed in a treatment chamber of a plasma CVD apparatus, which is vacuum-evacuated, is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the degradation efficiency of the source gas in plasma is increased, oxygen radicals are increased, and oxidation of the source gas is promoted; therefore, oxygen is contained in the oxide insulating film at a higher proportion than oxygen in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating.

Further, in the case of providing an oxide insulating film between the oxide semiconductor film 304 and the insulating layer 306, the oxide insulating film serves as a protective film of the oxide semiconductor film 304 in the steps of forming the insulating layer 306. Thus, the insulating layer 306 can be formed using the high-frequency power having a high power density while damage to the oxide semiconductor film 304 is reduced.

For example, a silicon oxide film or a silicon oxynitride film is formed as the oxide insulating film under the conditions as follows: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of a source gas into the treatment chamber, and high-frequency power is supplied to an electrode provided in the treatment chamber. Further, when the pressure in the treatment chamber is greater than or equal to 100 Pa and less than or equal to 250 Pa, damage to the oxide semiconductor film 304 can be reduced.

A deposition gas containing silicon and an oxidizing gas are preferably used as a source gas of the oxide insulating film. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

The insulating layer 307 can be formed by a sputtering method, a CVD method, or the like.

In the case where the insulating layer 307 is formed using a silicon nitride film or a silicon nitride oxide film, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples. As the gas containing nitrogen, nitrogen and ammonia can be given as examples.

Through the above process, the transistor 300 can be formed.

<Modification Examples of Transistor 300>

Structure examples of transistors which are partly different from the transistor 300 are described below.

FIG. 7B illustrates a schematic cross-sectional view of a transistor 310. The transistor 310 is different from the transistor 300 in the structure of an oxide semiconductor film.

In an oxide semiconductor layer 314 included in the transistor 310, an oxide semiconductor film 314a and an oxide semiconductor film 314b are stacked.

Since a boundary between the oxide semiconductor layer 314a and the oxide semiconductor layer 314b is unclear in some cases, the boundary is shown by a dashed line in FIG. 7B and the like.

The oxide semiconductor film of one embodiment of the present invention can be applied to at least one of the oxide semiconductor films 314a and 314b. That is, at least one of the oxide semiconductor films 314a and 314b is an oxide semiconductor film having a single crystal region.

Typical examples of a material that can be used for the oxide semiconductor film 314a are an In—Ga oxide, an In—Zn oxide, and an In-M-Zn oxide (M is Al, Ti, Ga, Y, Zr, La, Ce, Nd, or Hf). In the case of using an In-M-Zn oxide for the oxide semiconductor film 314a, when Zn and oxygen are eliminated from consideration, the proportions of In and M are preferably greater than or equal to 25 atomic % and less than 75 atomic %, respectively, and further preferably greater than or equal to 34 atomic % and less than 66 atomic %, respectively. Further, a material having an energy gap of 2 eV or more, preferably 2.5 eV or more, further preferably 3 eV or more is used for the oxide semiconductor film 314a, for example.

For example, the oxide semiconductor film 314b contains one or more kinds of metal elements included in the oxide semiconductor film 314a. For example, the oxide semiconductor film 314b may be represented by an In-M-Zn oxide (M is a metal such as Al, Ti, Ga, Ge, Y, Zr, Sn, La, Ce, or Hf) and in which the atomic ratio of M to In is higher than that in the oxide semiconductor layer 314a. Specifically, for the oxide semiconductor film 314b, an oxide semiconductor including the element M at a proportion 1.5 times or more, preferably twice or more, further preferably 3 times or more that in the oxide semiconductor film 314a is used. The element M is more strongly bonded to oxygen than indium is, and thus has a function of suppressing generation of oxygen vacancies. Accordingly, oxygen vacancies are more unlikely to be generated in the oxide semiconductor film 314b than in the oxide semiconductor film 314a.

Further, the oxide semiconductor film 314b is an In-M-Zn oxide (M is Al, Ti, Ga, Y, Zr, La, Ce, Nd, or Hf). In addition, the energy at the bottom of the conduction band of the oxide semiconductor film 314b is closer to the vacuum level than that of the oxide semiconductor film 314a is. Typically, the difference between the energy at the bottom of the conduction band of the oxide semiconductor film 314b and the energy at the bottom of the conduction band of the oxide semiconductor film 314a is preferably 0.05 eV or more, 0.07 eV or more, 0.1 eV or more, or 0.15 eV or more and 2 eV or less, 1 eV or less, 0.5 eV or less, or 0.4 eV or less.

For example, in the case of using an In-M-Zn oxide for the oxide semiconductor film 314b, when Zn and oxygen are eliminated from consideration, the proportions of In and M are preferably greater than or equal to 50 atomic % and less than 50 atomic %, respectively, and further preferably greater than or equal to 25 atomic % and less than 75 atomic %, respectively.

For example, as the oxide semiconductor film 314a, an In—Ga—Zn oxide with an atomic ratio of In:Ga:Zn=1:1:1 or 3:1:2 can be used. As the oxide semiconductor film 314b, an In—Ga—Zn oxide with an atomic ratio of In:Ga:Zn=1:3:2, 1:6:4, or 1:9:6 can be used. Note that the atomic ratio of each of the oxide semiconductor films 314a and 314b varies within a range of ±20% of the above atomic ratio as an error.

Note that, without limitation to those described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor films 314a and 314b be set to be appropriate.

Although a structure in which two oxide semiconductor films are stacked is described above as an example of the oxide semiconductor film 314, a structure in which three or more oxide semiconductor films are stacked can also be employed.

FIG. 7C illustrates a schematic cross-sectional view of a transistor 320. The transistor 320 is different from the transistor 300 and the transistor 310 in the structure of an oxide semiconductor film.

In an oxide semiconductor film 324 included in the transistor 320, an oxide semiconductor film 324a, an oxide semiconductor film 324b, and an oxide semiconductor film 324c are stacked in this order.

The oxide semiconductor films 324a and 324b are stacked over the insulating layer 303. The oxide semiconductor film 324c is provided in contact with the top surface of the oxide semiconductor film 324b and the top surfaces and side surfaces of the source electrode layer 305a and the drain electrode layer 305b.

The oxide semiconductor film of one embodiment of the present invention can be applied to at least one of the oxide semiconductor films 324a, 324b, and 324c. That is, at least one of the oxide semiconductor films 324a, 324b, and 324c is an oxide semiconductor film having a single crystal region.

The oxide semiconductor film 324b can have a structure which is similar to that of the oxide semiconductor film 314a described as an example in FIG. 7B, for example. Further, the oxide semiconductor films 324a and 324c can each have a structure which is similar to that of the oxide semiconductor film 314b described as an example in FIG. 7B, for example.

An oxide containing a large amount of Ga is used for the oxide semiconductor film 324a, which is provided under the oxide semiconductor film 324b, and the oxide semiconductor film 324c, which is provided over the oxide semiconductor film 324b, for example; thus, oxygen can be prevented from being released from the oxide semiconductor film 324a, the oxide semiconductor film 324b, and the oxide semiconductor film 324c.

In the case where a channel is mainly formed in the oxide semiconductor film 324b, for example, an oxide containing a large amount of In can be used for the oxide semiconductor film 324b and the source electrode layer 305a and the drain electrode layer 305b are provided in contact with the oxide semiconductor film 324b; thus, the on-state current of the transistor 320 can be increased.

<Another Structure Example of Transistor>

A structure example of a top-gate transistor to which the oxide semiconductor film of one embodiment of the present invention can be applied is described below.

Note that descriptions of components having structures or functions similar to those of the above, which are denoted by the same reference numerals, are omitted below.

Figure 9A:
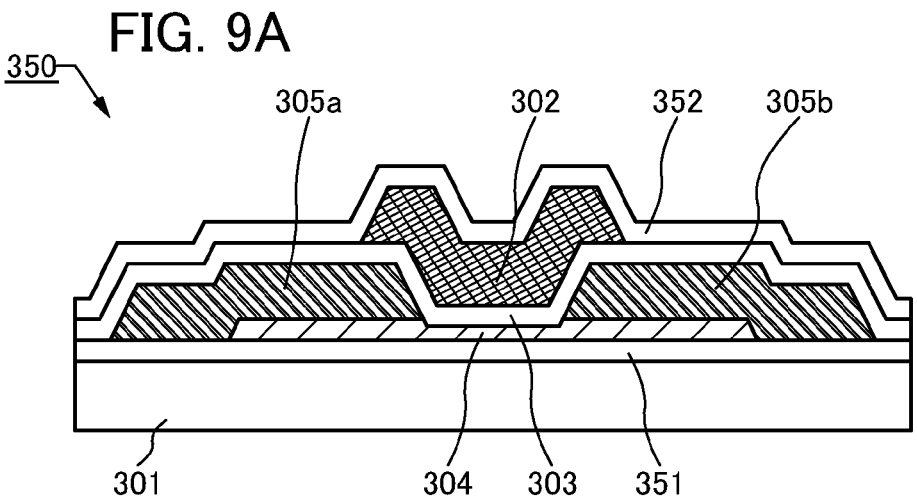
FIGS. 9A to 9C illustrate structure examples of transistors according to one embodiment.

FIG. 9A illustrates a schematic cross-sectional view of a top-gate transistor 350.

The transistor 350 includes the oxide semiconductor film 304 over the substrate 301 provided with an insulating layer 351, the source electrode layer 305a and the drain electrode layer 305b which are in contact with the top surface of the oxide semiconductor film 304, the insulating layer 303 over the oxide semiconductor film 304, the source electrode layer 305a, and the drain electrode layer 305b, and the gate electrode layer 302 over the insulating layer 303, which overlaps with the oxide semiconductor film 304. Moreover, an insulating layer 352 covers the insulating layer 303 and the gate electrode layer 302.

The oxide semiconductor film of one embodiment of the present invention can be applied to the oxide semiconductor film 304 included in the transistor 350.

The insulating layer 351 has a function of suppressing diffusion of impurities from the substrate 301 to the oxide semiconductor film 304. For example, a structure similar to that of the insulating layer 307 can be employed. Note that the insulating layer 351 is not necessarily provided.

The insulating layer 352 can be formed using an insulating film having a blocking effect against oxygen, hydrogen, water, and the like in a manner similar to that of the insulating layer 307. Note that the insulating layer 307 is not necessarily provided.

A structure example of a transistor which is partly different from the transistor 350 is described below.

Figure 9B:
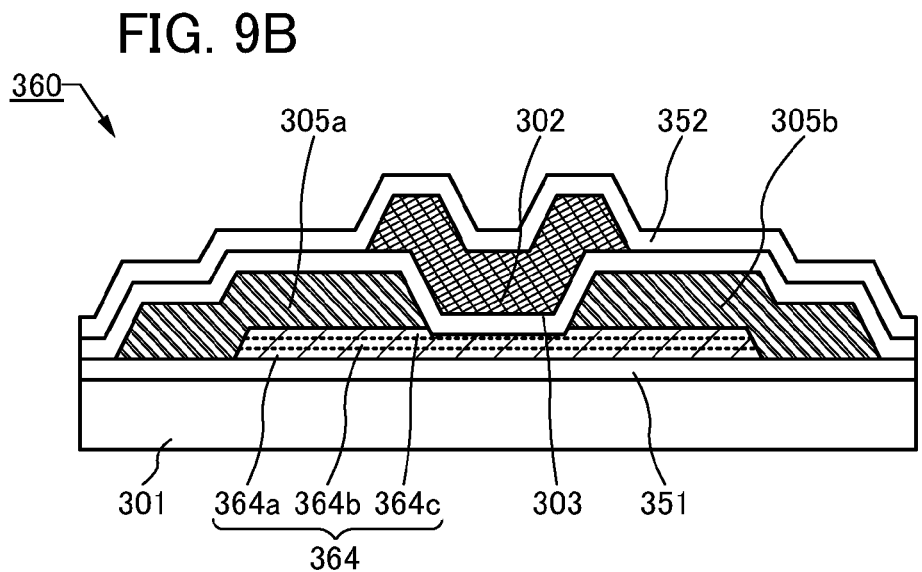

FIG. 9B illustrates a schematic cross-sectional view of a transistor 360. The transistor 360 is different from the transistor 350 in the structure of an oxide semiconductor film In an oxide semiconductor film 364 included in the transistor 360, an oxide semiconductor film 364a, an oxide semiconductor film 364b, and an oxide semiconductor film 364c are stacked in this order.

The oxide semiconductor film of one embodiment of the present invention can be applied to at least one of the oxide semiconductor films 364a, 364b, and 364c. That is, at least one of the oxide semiconductor films 364a, 364b, and 364c is an oxide semiconductor film having a single crystal region.

The oxide semiconductor film 364b can have a structure which is similar to that of the oxide semiconductor film 314a described as an example in FIG. 7B, for example. Further, the oxide semiconductor films 364a and 364c can each have a structure which is similar to that of the oxide semiconductor film 314b described as an example in FIG. 7B, for example.

An oxide containing a large amount of Ga that serves as a stabilizer is used for the oxide semiconductor film 324a, which is provided below the oxide semiconductor film 364b, and the oxide semiconductor film 364c, which is provided over the oxide semiconductor film 364b, for example; thus, oxygen can be prevented from being released from the oxide semiconductor film 364a, the oxide semiconductor film 364b, and the oxide semiconductor film 364c.

The oxide semiconductor film 364 can be formed in the following manner: the oxide semiconductor film 364c and the oxide semiconductor film 364b are obtained by etching, so that an oxide semiconductor film to be the oxide semiconductor film 364a is exposed; and the oxide semiconductor film is processed into the oxide semiconductor film 364a by a dry etching method. In that case, a reaction product of the oxide semiconductor film is attached to side surfaces of the oxide semiconductor films 364b and 364c to form a sidewall protective layer (also referred to as a rabbit ear) in some cases. Note that the reaction product is attached by a sputtering phenomenon or through plasma at the time of the dry etching.

Figure 9C:
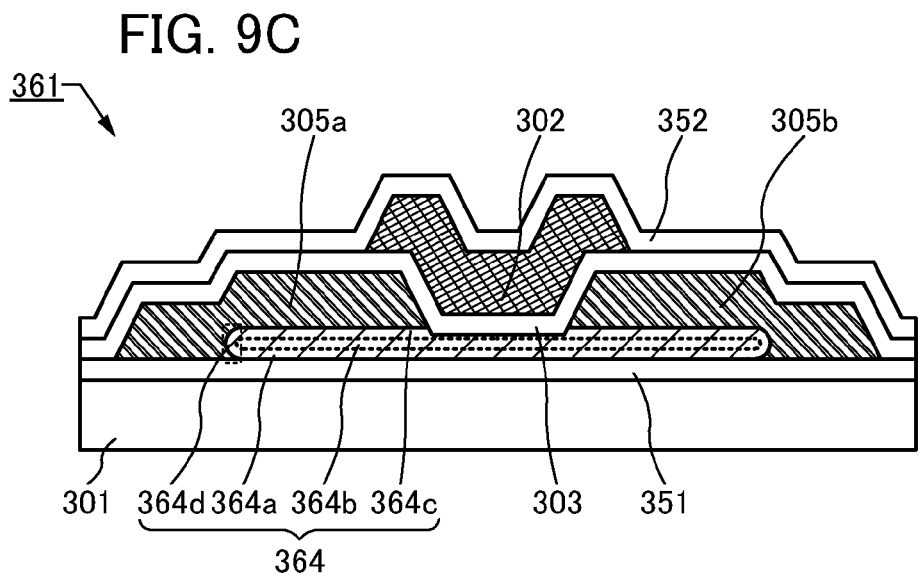

FIG. 9C is a schematic cross-sectional view of a transistor 361 in which a sidewall protective layer 364d is formed as a side surface of the oxide semiconductor film 364 in the above manner.

The sidewall protective layer 364d mainly contains the same material as the oxide semiconductor film 364a. In some cases, the sidewall protective layer 364d contains the constituent (e.g., silicon) of a layer provided below the oxide semiconductor film 364a (the insulating layer 351 here).

With a structure in which a side surface of the oxide semiconductor film 364b is covered with the sidewall protective layer 364d so as not to be in contact with the source electrode layer 305a and the drain electrode layer 305b as illustrated in FIG. 9C, unintended leakage current of the transistor in an off state can be reduced particularly when a channel is mainly formed in the oxide semiconductor film 364b; thus, a transistor having favorable off-state characteristics can be fabricated. Further, when a material containing a large amount of Ga is used for the sidewall protective layer 364d, oxygen can be effectively prevented from being released from the side surface of the oxide semiconductor layer 364b; thus, a transistor having excellent stability of electric characteristics can be fabricated.

Figure 10A:
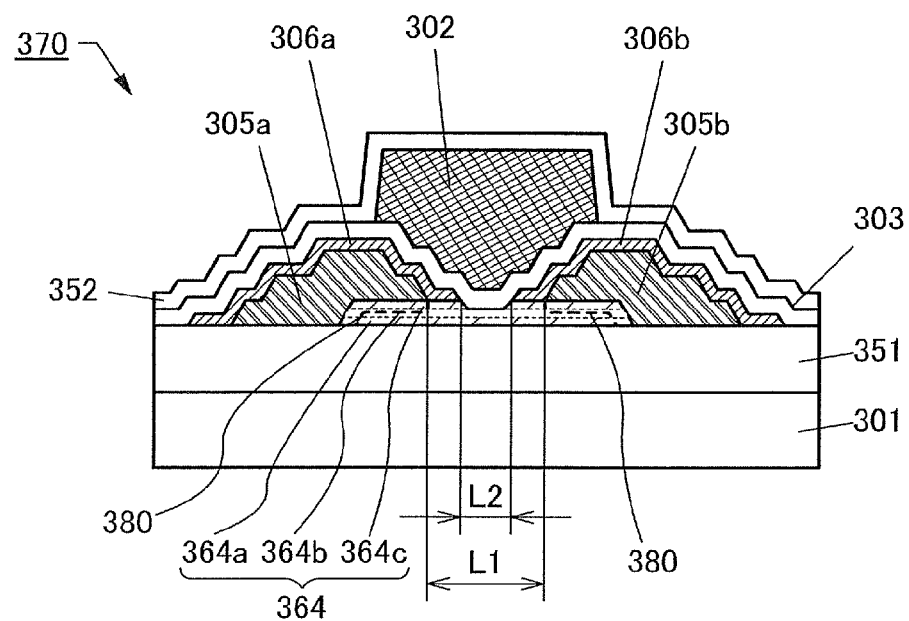
FIGS. 10A to 10C are a structure example and band diagrams of a transistor according to one embodiment.

FIG. 10A illustrates a schematic cross-sectional view of a transistor 370. The transistor 370 is different from the transistor 360 in the structures of a source electrode layer and a drain electrode layer. Specifically, the transistor 370 is different from the transistor 360 in that a source electrode layer 306a is provided over the source electrode layer 305a and a drain electrode layer 306b is provided over the drain electrode layer 305b.

As described above, in the case where a material with which oxygen vacancies can be generated in the oxide semiconductor film is used for the source electrode layer 305a and the drain electrode layer 305b, oxygen vacancies are generated in and around a region of the oxide semiconductor film which is in contact with the source electrode layer 305a or the drain electrode layer 305b, so that the region becomes n-type and the n-type region can serve as a source or drain region of the transistor.

However, when a transistor having an extremely short channel length is formed, the region which becomes n-type by the occurrence of oxygen vacancies might extend in a direction of the channel length of the transistor. In that case, electrical characteristics of the transistor change; for example, the threshold voltage shifts or the source region and the drain region are electrically connected to each other and the on-state and the off-state of the transistor cannot be controlled. Accordingly, when a transistor with an extremely short channel length is formed, it is not preferable that the conductive material which is easily bonded to oxygen be used for the source electrode layer and the drain electrode layer.

For this reason, the distance between the source electrode layer 305a and the drain electrode layer 305b shown as L1 in FIG. 10A is 0.8 μm or longer, preferably, 1.0 lam or longer. When L1 is shorter than 0.8 μm, it is possible that an adverse effect of oxygen vacancies generated in the channel formation region cannot be prevented and electrical characteristics of the transistor are degraded. Note that L1 refers to the shortest distance between an end portion of the source electrode layer 305a and an end portion of the drain electrode layer 305b which are in contact with the oxide semiconductor layer 364 and face each other. Note that in FIG. 10A, n-type regions 380 are illustrated schematically with a dotted line.

In the transistor 370, the source electrode layer 306a is formed in contact with the source electrode layer 305a and the oxide semiconductor film 364 by using a conductive material which is not easily bonded to oxygen. In addition, the drain electrode layer 306b is formed using a conductive material which is not easily bonded to oxygen to be in contact with the drain electrode layer 305b and the oxide semiconductor film 364.

The source electrode layer 306a extends in a direction of L1 beyond an end portion of the source electrode layer 305a in contact with the oxide semiconductor film 364. The drain electrode layer 306b extends in the direction of L1 beyond an end portion of the drain electrode layer 305b in contact with the oxide semiconductor film 364.

The extended portion of the source electrode layer 306a and the extended portion of the drain layer 306b are in contact with the oxide semiconductor film 364 (in particular, the oxide semiconductor film 364c). In the transistor 370 illustrated in FIG. 10A, a distance between an end portion of the extended portion of the source electrode layer 306a, the end portion being in contact with the oxide semiconductor film 364 and an end portion of the extended portion of the drain electrode layer 306b, the end portion being in contact with the oxide semiconductor film 364 corresponds to the channel length. The channel length is shown as L2 in FIG. 10A.

As a conductive material which is not easily bonded to oxygen and which is used to form the source electrode layer 306a and the drain electrode layer 306b, for example, a conductive nitride such as tantalum nitride or titanium nitride, or ruthenium is preferably used. Note that the conductive material which is not easily bonded to oxygen includes, in its category, a material to which oxygen is not easily diffused. The thickness of the conductive material is preferably greater than or equal to 5 nm and less than or equal to 500 nm, further preferably greater than or equal to 10 nm and less than or equal to 300 nm, still further preferably greater than or equal to 10 nm and less than or equal to 100 nm.

By the use of the above conductive material which is not easily bonded to oxygen for the source electrode layer 306a and the drain electrode layer 306b, generation of oxygen vacancies in the channel formation region of the oxide semiconductor film 364 can be suppressed, so that change of the channel formation region into an n-type can be suppressed. In this manner, even a transistor with an extremely short channel length can have favorable electrical characteristics. That is, L2 can be smaller than L1; for example, even when L2 is 30 nm or shorter, the transistor can show favorable electrical characteristics. Further, in the case where the width of a single crystal region included in the oxide semiconductor film 364 is greater than or equal to 30 nm, the entire channel formation region may be a single-crystal oxide semiconductor film in a cross-section in the channel length direction.

Note that a conductive nitride such as tantalum nitride or titanium nitride may occlude hydrogen. Therefore, when a conductive nitride is provided in contact with the oxide semiconductor film 364, the hydrogen concentration of the oxide semiconductor film 364 can be reduced.

Note that when a transistor with an extremely short channel length is formed, the source electrode layer 306a and the drain electrode layer 306b may be formed in such a manner that a resist mask is formed by a method suitable for thin line processing, such as an electron beam exposure, and then etching treatment is performed. Note that by the use of a positive type resist for the resist mask, the exposed region can be minimized and throughput can be thus improved. In the above manner, a transistor having a channel length of 30 nm or less can be manufactured.

Figure 10B:
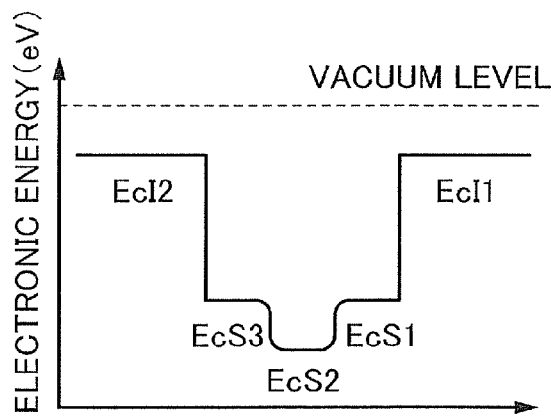
Figure 10C:
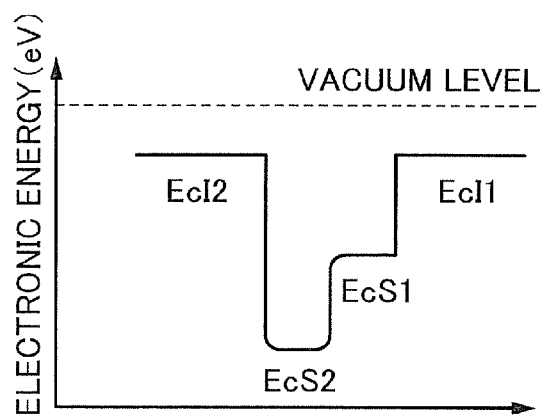

FIGS. 10B and 10C are band diagrams of a stacked-layer structure included in the transistor 370.

In FIGS. 10B and 10C, the vertical axis represents electron energy (eV) and the horizontal axis represents distance. Here, EcI1 and EcI2 represent energy at the bottom of the conduction band of the insulating film (e.g., the silicon oxide film), EcS1 represents energy at the bottom of the conduction band of the oxide semiconductor film 364a, EcS2 represents energy at the bottom of the conduction band of the oxide semiconductor film 364b, and EcS3 represents energy at the bottom of the conduction band of the oxide semiconductor film 364c.

As shown in FIG. 10B, the energies at the bottoms of the conduction bands of the oxide semiconductor film 364a, the oxide semiconductor film 364b, and the oxide semiconductor film 364c are changed continuously.

Note that although the case where the oxide semiconductor film 364a and the oxide semiconductor film 364c have the same or substantially the same energy gap is shown in FIG. 10B, the oxide semiconductor film 364a and the oxide semiconductor film 364c may have different energy gaps.

According to FIG. 10B, the oxide semiconductor film 364b of the oxide semiconductor film 364 serves as a well and a channel of the transistor including the oxide semiconductor film 364 is formed in the oxide semiconductor film 364b. Note that since the energies at the bottoms of the conduction bands are changed continuously, the oxide semiconductor film 364 can also be referred to as a U-shaped well. Further, a channel formed to have such a structure can also be referred to as a buried channel.

Since each of the oxide semiconductor film 364a and the oxide semiconductor film 364c is a film containing one or more kinds of metal elements forming the oxide semiconductor film 364b, the oxide semiconductor film 364 can also be referred to as an oxide semiconductor stacked film in which layers containing the same main components are stacked. The oxide semiconductor stacked film in which layers containing the same main components are stacked is formed to have not only a simple stacked-layer structure of the layers but also a continuous energy band (here, in particular, a well structure having a U shape in which energies at the bottoms of the conduction bands are changed continuously between layers). This is because when a defect level or an impurity for an oxide semiconductor, for example, a defect level such as a trapping center or a recombination center, or an impurity forming a barrier which inhibits the flow of carriers is mixed at an interface between any two of the layers, the continuity of the energy band is lost, and thus carriers are trapped or disappear by recombination at the interface.

In order to form a continuous energy band, the layers needs to be stacked successively without exposure to the air with the use of a multi-chamber deposition apparatus (a sputtering apparatus) including a load lock chamber. Each chamber of the sputtering system is preferably evacuated to a high vacuum (to about $1\times10^{-4}$ Pa to $5\times10^{-7}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

The oxide semiconductor film 364a and the oxide semiconductor film 364c which are provided over and under the oxide semiconductor film 364b each serve as a barrier layer and can prevent a trap level formed at an interface between the oxide semiconductor film 364 and each of the insulating layers which are in contact with the oxide semiconductor film 364 from adversely affecting the oxide semiconductor film 364b which serves as a main carrier path for the transistor.

For example, oxygen vacancies contained in the oxide semiconductor film appear as localized states in deep energy area in the energy gap of the oxide semiconductor. A carrier is trapped in such localized states, so that reliability of the transistor is lowered. For this reason, oxygen vacancies contained in the oxide semiconductor film need to be reduced. The oxide semiconductor films in which oxygen vacancies are less likely to be generated than in the oxide semiconductor film 364b are provided over and under and in contact with the oxide semiconductor film 364b in the oxide semiconductor film 364, whereby oxygen vacancies in the oxide semiconductor film 364b can be reduced. For example, in the oxide semiconductor film 364b, the absorption coefficient due to the localized levels, which is obtained by measurement by a constant photocurrent method (CPM) is set lower than $1\times10^{-3}$/cm, preferably lower than $1\times10^{-4}$/cm.

In addition, when the oxide semiconductor film 364b is in contact with an insulating layer including a different constituent element, an interface state is sometimes formed at the interface of the two layers and the interface state forms a channel. At this time, a second transistor having a different threshold voltage appears, so that an apparent threshold voltage of the transistor is varied. However, since the oxide semiconductor film 364a contains one or more kinds of metal elements forming the oxide semiconductor film 364b in the oxide semiconductor film 364, an interface state is less likely to be formed at an interface between the two layers. Thus, providing the oxide semiconductor film 364a makes it possible to reduce fluctuation in the electrical characteristics of the transistor, such as threshold voltage.

In the case where a channel is formed at an interface between the insulating layer 303 and the oxide semiconductor film 364b, interface scattering occurs at the interface and the field-effect mobility of the transistor is decreased. However, since the oxide semiconductor film 364c contains one or more kinds of metal elements forming the oxide semiconductor film 364b in the oxide semiconductor film 364, scattering of carriers is less likely to occur at an interface between the two layers, and thus the field-effect mobility of the transistor can be increased.

Further, the oxide semiconductor film 364a and the oxide semiconductor film 364c each also serve as a barrier layer which suppresses formation of an impurity level due to the entry of the constituent elements of the insulating layers which are in contact with the oxide semiconductor film 364 (the insulating layer 351 and the insulating layer 303) into the oxide semiconductor film 364b. It is particularly preferable to sandwich or surround the oxide semiconductor film 364b serving as a carrier path by the oxide semiconductor film 364a and the oxide semiconductor film 364c in order to prevent entry of much silicon or carbon, which is a Group 14 element, to the oxide semiconductor film 364b. That is, the concentration of silicon and carbon contained in the oxide semiconductor film 364b is preferably lower than that in the oxide semiconductor film 364a and the oxide semiconductor film 364c.

For example, the concentration of silicon contained in the oxide semiconductor film 364b is lower than or equal to $3\times10^{18}$/cm$^3$, preferably lower than or equal to $1\times10^{18}$/cm$^3$, further preferably lower than or equal to $3\times10^{17}$/cm$^3$. In addition, the concentration of carbon contained in the oxide semiconductor film 364b is controlled to be lower than or equal to $3\times10^{18}$/cm$^3$, preferably lower than or equal to $3\times10^{17}$/cm$^3$. Note that the impurity concentration of the oxide semiconductor film can be measured by secondary ion mass spectrometry (SIMS).

If hydrogen or moisture is contained in the oxide semiconductor film as an impurity, it can work as a donor and form an n-type region; therefore, in order to achieve a well-shaped structure, it is useful to provide a protective insulating layer (e.g. a silicon nitride layer) for preventing entry of hydrogen or moisture from the outside, above the oxide semiconductor film 364.

As illustrated in FIG. 10B, trap levels derived from an impurity or a defect can be formed in the vicinity of the interfaces between the oxide semiconductor film 364a and the insulating layer 351 and between the oxide semiconductor film 364c and the insulating layer 303. Therefore, the oxide semiconductor film 364a and the oxide semiconductor film 364c enable the oxide semiconductor film 364b and the trap levels to be separated from each other. However, when the energy difference between EcS1 and EcS2 and the energy difference between EcS3 and EcS2 is small, an electron in the oxide semiconductor film 364b might reach the trap level by passing over the energy difference. When an electron is trapped in the trap level, negative charge is generated at the interface with the insulating film, causing positive shift of the threshold voltage of the transistor.

Thus, the energy gap between EcS1 and EcS2 and the energy gap between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

In the transistor illustrated in FIG. 10A, an upper portion of the oxide semiconductor film 364, i.e., the oxide semiconductor film 364c, may be etched in the formation of the source electrode layer 306a and the drain electrode layer 306b. In addition, a mixed layer of the oxide semiconductor film 364b and the oxide semiconductor film 364c may be formed on a top surface of the oxide semiconductor film 364b in the formation of the oxide semiconductor film 364c.

In the case where the oxide semiconductor film 364b is an In—Ga—Zn oxide with an atomic ratio of In:Ga:Zn=1:1:1 or an In—Ga—Zn oxide with an atomic ratio of In:Ga:Zn=3:1:2 and the oxide semiconductor film 364c is an In—Ga—Zn oxide with an atomic ratio of In:Ga:Zn=1:3:2 or an In—Ga—Zn oxide with an atomic ratio of In:Ga:Zn=1:6:4, the Ga content in the oxide semiconductor film 364c is higher than that in the oxide semiconductor film 364b; therefore, a mixed layer which contains more Ga than a GaOx layer or the oxide semiconductor film 364b does can be formed on the top surface of the oxide semiconductor film 364b.

Therefore, the energy at the bottom of the conduction band of EcS2 on the EcI2 side is increased and the band structure shown in FIG. 10C is exhibited in some case. That is, in the band structure shown in FIG. 10C, there is not EcS3 showing the energy at the bottom of the conduction band of the oxide semiconductor film 364c in FIG. 10B and the energy at the bottom of the conduction band of EcS2 on the EcI2 side is high.

With the structure of the oxide semiconductor stacked film which is described above, interface scattering is unlikely to occur at an interface of the oxide semiconductor film serving as a channel. Thus, motion of carriers is not impeded at the interface, resulting in higher field-effect mobility of the transistor. In addition, the formation of the oxide semiconductor films which are in contact with the oxide semiconductor film serving as a channel and which serve as barrier films can prevent impurities from entering the channel, so that the transistor can have stable electrical characteristics.

This embodiment can be combined with any of the other embodiments disclosed in this specification as appropriate.

Embodiment 4

Figure 13A:
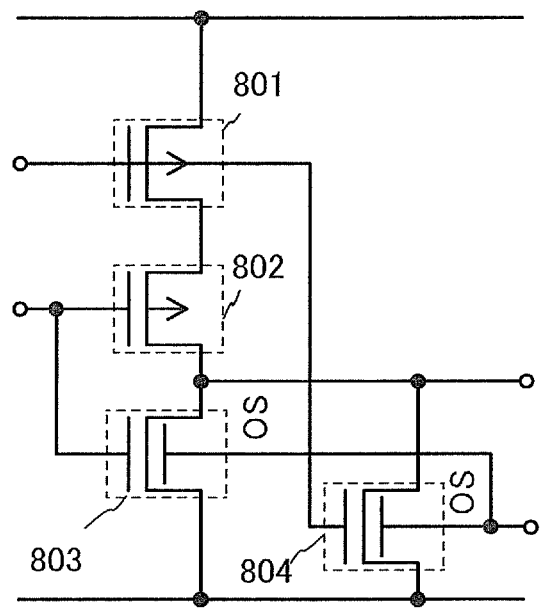
FIGS. 13A and 13B are circuit diagrams each illustrating a semiconductor device of one embodiment of the present invention.
Figure 13B:
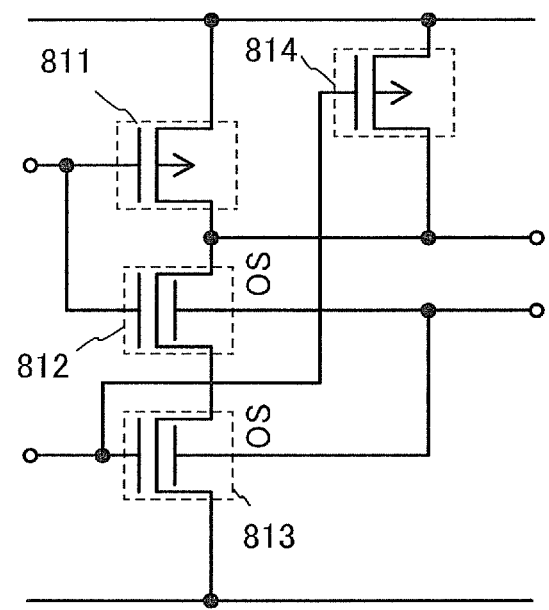

FIG. 13A illustrates an example of a circuit diagram of a NOR circuit, which is a logic circuit, as an example of the semiconductor device described in one embodiment of the present invention. FIG. 13B is a circuit diagram of a NAND circuit.

In the NOR circuit in FIG. 13A, p-channel transistors 801 and 802 are transistors in each of which a channel formation region is formed using a semiconductor material (e.g., silicon) other than an oxide semiconductor, and n-channel transistors 803 and 804 each include an oxide stack including an oxide semiconductor and each have a structure similar to that of the transistor described in Embodiment 3.

A transistor including a semiconductor material such as silicon can easily operate at high speed. On the other hand, a transistor including an oxide semiconductor enables charge to be held for a long time owing to its characteristics.

To miniaturize the logic circuit, it is preferable that the n-channel transistors 803 and 804 be stacked over the p-channel transistors 801 and 802. For example, the transistors 801 and 802 can be formed using a single crystal silicon substrate, and the transistors 803 and 804 can be formed over the transistors 801 and 802 with an insulating layer provided therebetween.

In the NAND circuit in FIG. 13B, p-channel transistors 811 and 814 are transistors in each of which a channel formation region is formed using a semiconductor material (e.g., silicon) other than an oxide semiconductor, and n-channel transistors 812 and 813 each include an oxide semiconductor film and each have a structure similar to that of the transistor described in Embodiment 3.

Note that in the NAND circuit shown in FIG. 13B, the transistors 812 and 813 each have a second gate electrode serving as a back gate electrode, and by controlling the potential of the second gate electrode, for example, by setting the potential to GND, the threshold voltages of the transistors 812 and 813 are increased, so that the transistors can be normally off.

As in the NOR circuit shown in FIG. 13A, to miniaturize the logic circuit, it is preferable that the n-channel transistors 812 and 813 be stacked over the p-channel transistors 811 and 814.

By applying a transistor including an oxide semiconductor for a channel formation region and having extremely small off-state current to the semiconductor device in this embodiment, power consumption of the semiconductor device can be sufficiently reduced.

A semiconductor device which is miniaturized, is highly integrated, and has stable and excellent electrical characteristics by stacking semiconductor elements including different semiconductor materials and a method for manufacturing the semiconductor device can be provided.

In addition, by employing the structure of the transistor including the oxide semiconductor film of one embodiment of the present invention, a NOR circuit and a NAND circuit with high reliability and stable characteristics can be provided.

Note that the NOR circuit and the NAND circuit including the transistor described in Embodiment 3 are described as examples in this embodiment; however, the present invention is not particularly limited to the circuits, and an AND circuit, an OR circuit, or the like can be formed using the transistor described in Embodiment 3.

Alternatively, it is possible to fabricate a display device by combining a display element with any of the transistors described in this embodiment and the other embodiments. For example, a display element, a display device which is a device including a display element, a light-emitting element, and a light-emitting device which is a device including a light-emitting element can employ various modes and can include various elements. For example, a display medium, whose contrast, luminance, reflectivity, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Note that examples of display devices having EL elements include an EL display and the like. Display devices having electron emitters include a field emission display (FED), an SED-type flat panel display (SED: surface-conduction electron-emitter display), and the like. Examples of display devices having liquid crystal elements include a liquid crystal display (e.g., a transmissive liquid crystal display, a transflective liquid crystal display, a reflective liquid crystal display, a direct-view liquid crystal display, or a projection liquid crystal display) and the like. Examples of display devices having electronic ink or electrophoretic elements include electronic paper.

The methods and structures described in this embodiment can be combined as appropriate with any of the methods and structures described in the other embodiments.

Embodiment 5

In this embodiment, an example of a semiconductor device (memory device) which includes the transistor described in Embodiment 3, which can hold stored data even when not powered, and which has an unlimited number of write cycles will be described with reference to drawings.

Figure 14A:
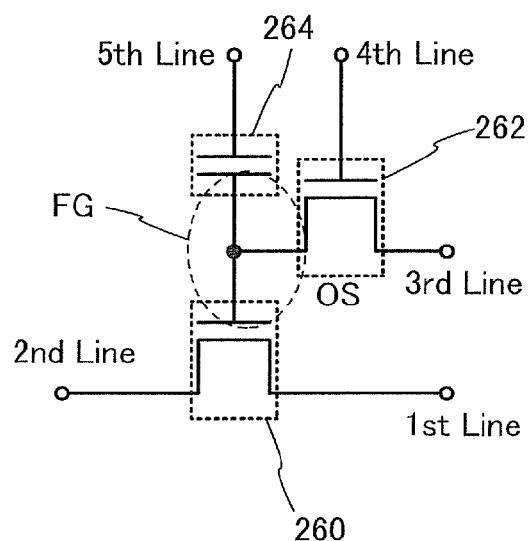
FIGS. 14A to 14C are circuit diagrams and a schematic diagram of a semiconductor device of one embodiment of the present invention.

FIG. 14A is a circuit diagram illustrating the semiconductor device of this embodiment.

A transistor including a semiconductor material (e.g., silicon) other than an oxide semiconductor can be applied to a transistor 260 illustrated in FIG. 14A and thus the transistor 260 can easily operate at high speed. Further, a structure similar to that of the transistor described in Embodiment 3, which includes an oxide semiconductor film of one embodiment of the present invention, can be applied to a transistor 262 to enable charge to be held for a long time owing to its characteristics.

Although all the transistors are n-channel transistors here, p-channel transistors can be used as the transistors used for the semiconductor device described in this embodiment.

In FIG. 14A, a first wiring (1st Line) is electrically connected to the source electrode layer of the transistor 260, and a second wiring (2nd Line) is electrically connected to a drain electrode layer of the transistor 260. A third wiring (3rd Line) is electrically connected to one of the source electrode layer and the drain electrode layer of the transistor 262, and a fourth wiring (4th Line) is electrically connected to a gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device in FIG. 14A can write, hold, and read data as described below, utilizing a characteristic in which the potential of the gate electrode layer of the transistor 260 can be held.

Writing and holding of data will be described. First, the potential of the fourth wiring is set to a potential at which the transistor 262 is turned on, so that the transistor 262 is turned on. Thus, the potential of the third wiring is applied to the gate electrode layer of the transistor 260 and the capacitor 264. In other words, a predetermined charge is supplied to the gate electrode layer of the transistor 260 (writing). Here, one of two kinds of charges providing different potential levels (hereinafter referred to as a low-level charge and a high-level charge) is supplied. After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data is described. By supplying an appropriate potential (reading potential) to the fifth wiring while supplying a predetermined potential (constant potential) to the first wiring, the potential of the second wiring varies depending on the amount of charge held in the gate electrode layer of the transistor 260. This is because in general, when the transistor 260 is an n-channel transistor, an apparent threshold voltage $V_{th\_H}$ in the case where a High level charge is given to the gate electrode layer of the transistor 260 is lower than an apparent threshold voltage $V_{th\_L}$ in the case where a Low level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby charge supplied to the gate electrode layer of the transistor 260 can be determined. For example, in the case where High level charge is given in writing, when the potential of the fifth wiring is set to $V_0$ ($>V_{th\_H}$), the transistor 260 is turned on. In the case where Low level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where such reading is not performed, a potential at which the transistor 260 is turned off regardless of the state of the gate electrode layer, that is, a potential smaller than $V_{th\_H}$ may be supplied to the fifth wiring. Alternatively, a potential at which the transistor 260 is turned on regardless of the state of the gate electrode layer, that is, a potential larger than $V_{th\_L}$ may be supplied to the fifth wiring.

Figure 14B:
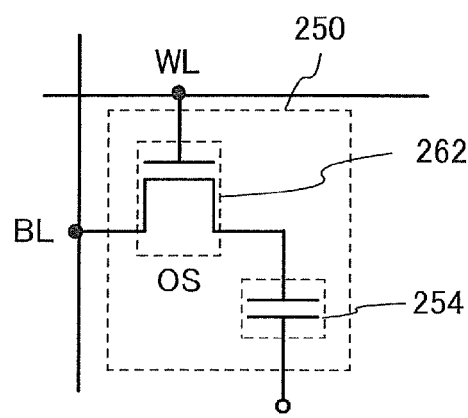
Figure 14C:
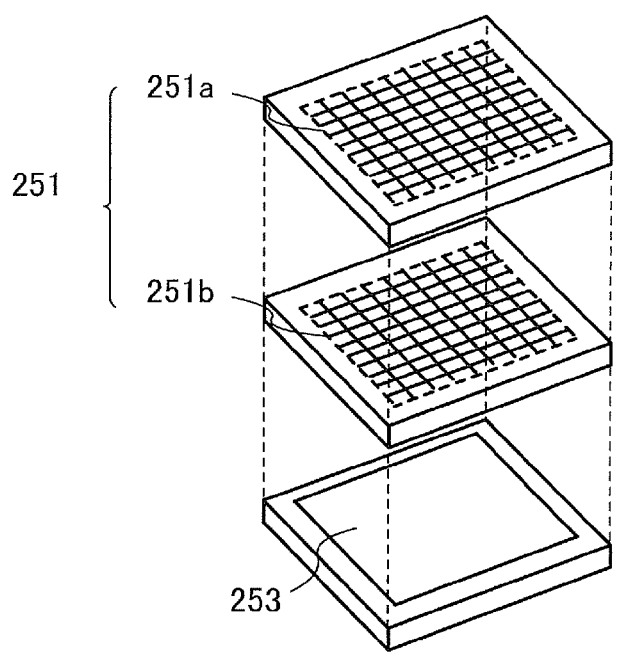

FIG. 14B illustrates another example of one embodiment of a structure of a memory device. FIG. 14B illustrates an example of a circuit configuration of a semiconductor device, and FIG. 14C is a schematic diagram illustrating an example of a semiconductor device. First, the semiconductor device illustrated in FIG. 14B will be described, and then the semiconductor device illustrated in FIG. 14C will be described.

In the semiconductor device illustrated in FIG. 14B, a bit line BL is electrically connected to the source electrode layer or the drain electrode layer of the transistor 262, a word line WL is electrically connected to the gate electrode layer of the transistor 262, and the source electrode layer or the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 14B will be described.

First, the potential of the word line WL is set to a potential at which the transistor 262 is turned on, so that the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or the charge accumulated in the capacitor) can be held for a long time.

Secondly, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 14B can hold charge that is accumulated in the capacitor 254 for a long time because the amount of the off-state current of the transistor 262 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 14C will be described.

The semiconductor device illustrated in FIG. 14C includes a memory cell array 251 (memory cell arrays 251a and 251b) including a plurality of memory cells 250 illustrated in FIG. 14B as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 14C, the peripheral circuit 253 can be provided under the memory cell array 251 (the memory cell arrays 251a and 251b). Thus, the size of the semiconductor device can be reduced.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 14C illustrates, as an example, the semiconductor device in which two memory cell arrays 251 (the memory cell arrays 251a and 251b) are stacked; however, the number of memory cell arrays which are stacked is not limited thereto. Three or more memory cells arrays may be stacked.

When a transistor including the oxide semiconductor film of one embodiment of the present invention in a channel formation region is used as the transistor 262, stored data can be held for a long time. In other words, power consumption can be sufficiently reduced because a semiconductor device in which refresh operation is unnecessary or the frequency of refresh operation is extremely low can be provided.

The methods and structures described in this embodiment can be combined as appropriate with any of the methods and structures described in the other embodiments.

Embodiment 6

In this embodiment, structures of a semiconductor device including the oxide semiconductor film of one embodiment of the present invention and electronic devices will be described with reference to FIG. 11 and FIGS. 12A to 12D.

Figure 11:
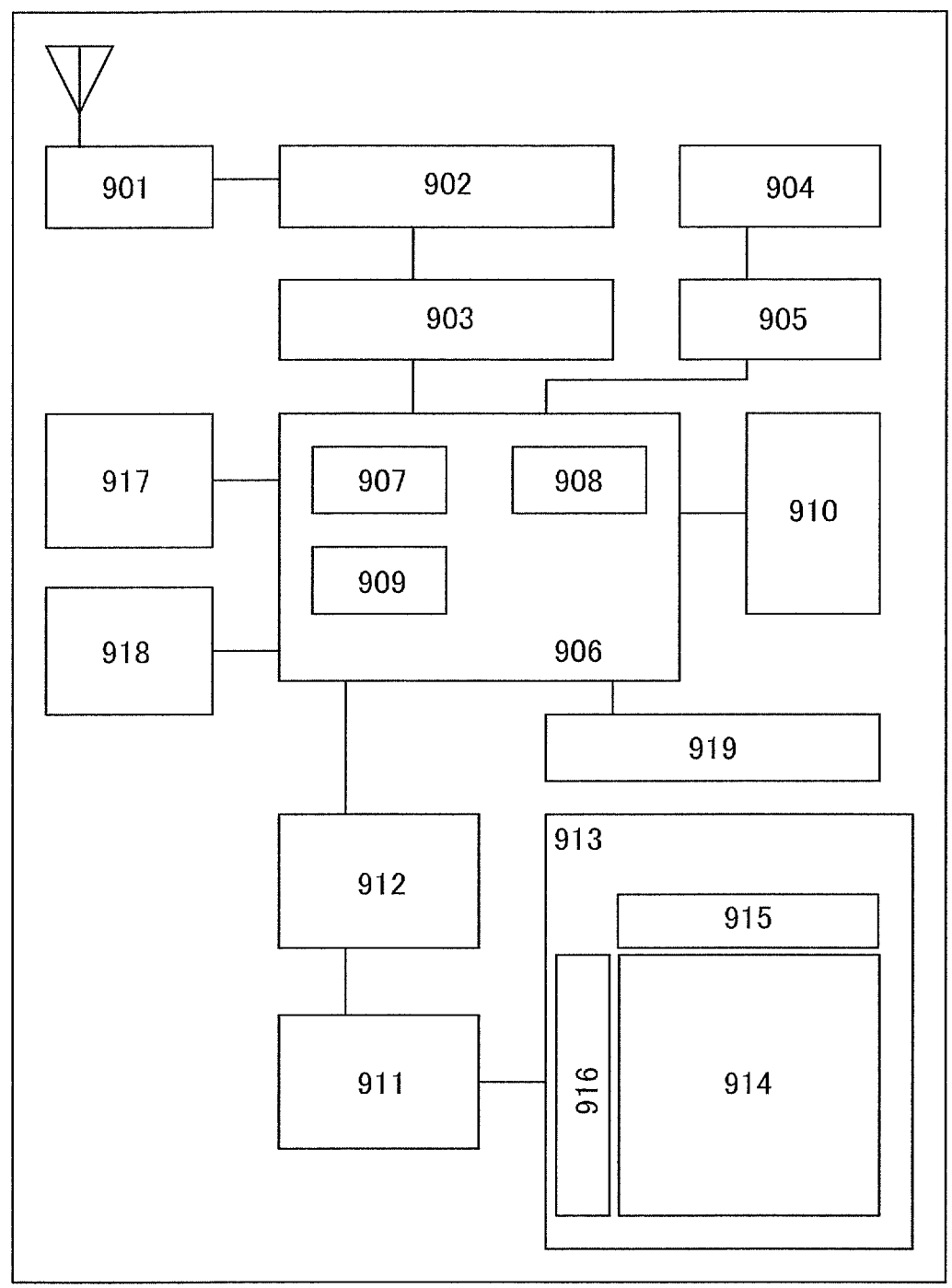
FIG. 11 is a block diagram of an electronic device according to one embodiment.

FIG. 11 is a block diagram of an electronic device including the semiconductor device to which the oxide semiconductor film of one embodiment of the present invention is applied.

FIGS. 12A to 12D are external views of electronic devices each including the semiconductor device to which the oxide semiconductor film of one embodiment of the present invention is applied.

An electronic device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like.

The application processor 906 includes a CPU 907, a DSP 908, and an interface (IF) 909. Moreover, the memory circuit 912 can include an SRAM or a DRAM.

The transistor described in Embodiment 3 is applied to the memory circuit 912, whereby a highly reliable electronic device which can write and read data can be provided.

The transistor described in Embodiment 3 is applied to a register or the like included in the CPU 907 or the DSP 908, whereby a highly reliable electronic device which can write and read data can be provided.

Note that in the case where the off-state leakage current of the transistor described in Embodiment 3 is extremely small, the memory circuit 912 can store data for a long time and can have sufficiently reduced power consumption. Moreover, the CPU 907 or the DSP 908 can store the state before power gating in a register or the like during a period in which the power gating is performed.

Further, the display 913 includes a display portion 914, a source driver 915, and a gate driver 916.

The display portion 914 includes a plurality of pixels arranged in a matrix. The pixel includes a pixel circuit, and the pixel circuit is electrically connected to the gate driver 916.

The transistor described in Embodiment 3 can be used as appropriate in the pixel circuit or the gate driver 916. Accordingly, a highly reliable display can be provided.

Examples of e electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 12A:
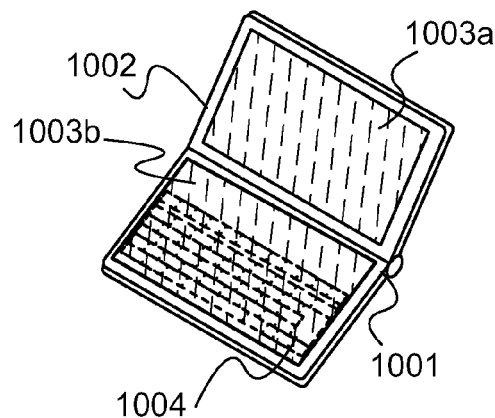
FIGS. 12A to 12D are each an external view of an electronic device according to one embodiment.

FIG. 12A illustrates a portable information terminal, which includes a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using the transistor described in Embodiment 3 as a switching element and applied to the display portion 1003a or 1003b, whereby a highly reliable portable information terminal can be provided.

The portable information terminal illustrated in FIG. 12A can have a function of displaying various kinds of data (e.g., a still image, a moving image, and a text image), a function of displaying a calendar, a date, the time, or the like on the display portion, a function of operating or editing data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an electronic book server.

Figure 12B:
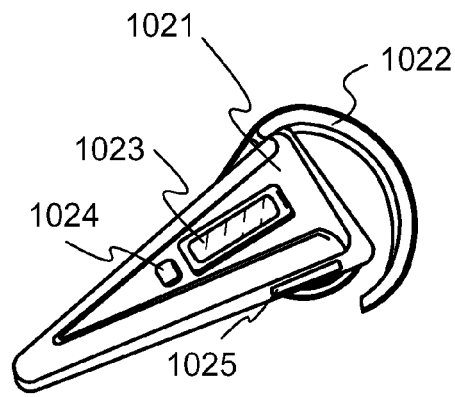

FIG. 12B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated by using the transistor described in Embodiment 3 as a switching element and applied to the display portion 1023, whereby a highly reliable portable music player can be provided.

Furthermore, when the portable music player illustrated in FIG. 12B has an antenna, a microphone function, or a wireless communication function and is used with a mobile phone, a user can talk on the phone wirelessly in a hands-free way while driving a car or the like.

Figure 12C:
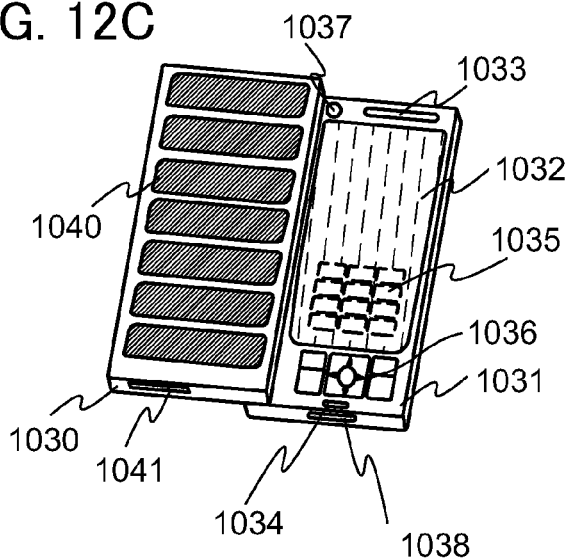

FIG. 12C illustrates a mobile phone which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in Embodiment 3 is applied to the display panel 1032, whereby a highly reliable mobile phone can be provided.

Further, the display panel 1032 includes a touch panel. A plurality of operation keys 1035 which are displayed as images are indicated by dotted lines in FIG. 12C. Note that a boosting circuit by which a voltage output from the solar cell 1040 is increased to be sufficiently high for each circuit is also included.

For example, a power transistor used for a power supply circuit such as a boosting circuit can also be formed when the oxide semiconductor film of the transistor described in the Embodiment 3 has a thickness of greater than or equal to 2 μm and less than or equal to 50 p.m.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 12C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 12D:
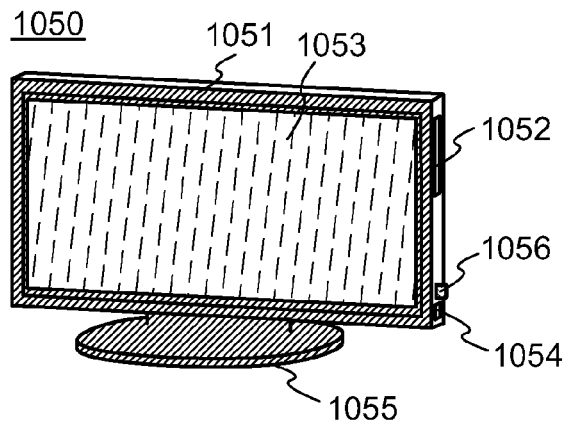

FIG. 12D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. The transistor described in Embodiment 3 is applied to the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) data communication can be performed.

Further, the television set 1050 is provided with an external connection terminal 1054, a storage medium recording and reproducing portion 1052, and an external memory slot. The external connection terminal 1054 can be connected to a variety of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in Embodiment 3 is extremely small, when the transistor is applied to the external memory 1056 or the CPU, the television set 1050 can have high reliability and sufficiently reduced power consumption.

This application is based on Japanese Patent Application serial no. 2012-260230 filed with Japan Patent Office on Nov. 28, 2012, the entire contents of which are hereby incorporated by reference.

What is claimed is:

1. A semiconductor device comprising:
   a gate electrode layer;
   a first insulating layer over the gate electrode layer;
   a first oxide semiconductor layer over the first insulating layer;
   a second oxide semiconductor layer over the first oxide semiconductor layer;
   a source electrode layer and a drain electrode layer on and in contact with the second oxide semiconductor layer;
   a third oxide semiconductor layer on and in contact with the second oxide semiconductor layer, the source electrode layer, and the drain electrode layer,
   wherein at least one of the first, second, and third oxide semiconductor layers comprises a single crystal region having a crystal structure including indium, gallium, and zinc, and
   wherein the crystal structure of the single crystal region has bonds for forming a hexagonal lattice in an a-b plane of the crystal structure and includes a c-axis perpendicular to a surface of the first insulating layer.

2. The semiconductor device according to claim 1, wherein the gate electrode layer is provided on a substrate.

3. The semiconductor device according to claim 1, wherein the first insulating layer comprises one of a silicon oxide film, a silicon oxynitride film, or a silicon nitride oxide film.

4. The semiconductor device according to claim 1, wherein the single crystal region has no crystal grain boundary therein.

5. A semiconductor device comprising:
   a gate electrode layer;
   a first insulating layer over the gate electrode layer;
   a first oxide semiconductor layer having crystallinity including indium, gallium, and zinc over the first insulating layer;
   a second oxide semiconductor layer including indium, gallium, and zinc on the first oxide semiconductor layer;
   a source electrode layer and a drain electrode layer on and in contact with the second oxide semiconductor layer;
   a third oxide semiconductor layer on and in contact with the second oxide semiconductor layer, the source electrode layer, and the drain electrode layer, wherein the third oxide semiconductor layer covers side surfaces of the source electrode layer and the drain electrode layer;
   a second insulating layer over the source electrode layer, the drain electrode layer, and the third oxide semiconductor layer,
   wherein at least the second oxide semiconductor layer includes a single crystal region having a crystal structure including indium, gallium, and zinc and does not include a crystal grain boundary,
   wherein the crystal structure of the single crystal region has bonds for forming a hexagonal lattice in an a-b plane of the crystal structure and includes a c-axis perpendicular to a surface of the first oxide semiconductor film, and
   wherein the first oxide semiconductor layer and the second oxide semiconductor layer have different compositions.

6. The semiconductor device according to claim 5, wherein the gate electrode layer is provided on a substrate.

7. A semiconductor device comprising:
   a gate electrode layer;
   a gate insulating layer over the gate electrode layer;
   a first oxide semiconductor layer over the gate insulating layer;
   a second oxide semiconductor layer over the first oxide semiconductor layer;
   a source electrode layer and a drain electrode layer on and in contact with the second oxide semiconductor layer;
   a third oxide semiconductor layer on and in contact with upper surfaces of the second oxide semiconductor layer, the source electrode layer, and the drain electrode layer, wherein the third oxide semiconductor layer covers side surfaces of the source electrode layer and the drain electrode layer;

a second insulating layer over the source electrode layer, the drain electrode layer, and the third oxide semiconductor layer, wherein at least the second oxide semiconductor layer includes a single crystal region having a crystal structure including indium, gallium, and zinc and does not include a crystal grain boundary, and wherein the crystal structure of the single crystal region has bonds for forming a hexagonal lattice in an a-b plane and includes a c-axis perpendicular to a surface of the gate insulating layer.

8. The semiconductor device according to claim 7, further comprising a substrate on which the gate electrode layer is located.

* * * * *